United States Patent
Wang

(10) Patent No.: US 6,886,124 B2
(45) Date of Patent: Apr. 26, 2005

(54) LOW HARDWARE OVERHEAD SCAN BASED 3-WEIGHT WEIGHTED RANDOM BIST ARCHITECTURES

(75) Inventor: Seongmoon Wang, Plainsboro, NJ (US)

(73) Assignee: NEC Corporation, Tokyo (JP)

( * ) Notice: Subject to any disclaimer, the term of this patent is extended or adjusted under 35 U.S.C. 154(b) by 455 days.

(21) Appl. No.: 09/805,899

(22) Filed: Mar. 15, 2001

(65) Prior Publication Data

US 2003/0149927 A1 Aug. 7, 2003

Related U.S. Application Data

(60) Provisional application No. 60/266,845, filed on Feb. 7, 2001.

(51) Int. Cl.$^7$ .............................................. G06F 11/00
(52) U.S. Cl. ..................................................... 714/738
(58) Field of Search ................................ 714/738–739, 714/724, 742; 708/250

(56) References Cited

U.S. PATENT DOCUMENTS

| | | | | |
|---|---|---|---|---|
| 5,323,400 A | * | 6/1994 | Agarwal et al. | 714/728 |
| 5,612,963 A | * | 3/1997 | Koenemann et al. | 714/739 |
| 6,061,818 A | * | 5/2000 | Touba et al. | 714/739 |
| 6,067,651 A | * | 5/2000 | Rohrbaugh et al. | 714/738 |
| 6,662,327 B1 | * | 12/2003 | Rajski | 714/738 |
| 6,694,466 B1 | * | 2/2004 | Tsai et al. | 714/729 |

OTHER PUBLICATIONS

Geuzebroek et al., test point insertion for compact test sets, 2000, goggle.com, p. 1 to 10.*
Strole et al., TESTCHIP: a chip for weight random pattern generation, evaluation and test control, Jul. 1991, IEEE journal of SS Ckt vol. 26, No. 7, p. 1056–1063.*
Stephan et al. Combination test generation using stisfiability, Sep. 1996, IEEE Trans on computer Aid Design vol. 15, No. 9, p. 1167, 1176.*
Neebel et al., multiple weighted cellular automata, 1994, IEEE, p. 81 to 86.*
AlShaibi et al., fixed biased pseudorandom built in self test for random pattern resistant circuits, 1994, IEEE p. 929 to 938.*
Kapur et al. design of an effective weighted random pattern generation system, 1994, IEEE, p. 491–500.*
Goel, AN implicit Enumeration algorithm to generate tests for combinational logic circuits, 1996, IEEE proceedings of FTCS–25 vol. III, p. 337–343.*
Goldstein, Controllability/Observability analysis for digital circuits, Sep. 1979, IEEE, Trans on CKTs CAS–26, No. 9, p. 685–693.*
M. Abramovici, M. A. Breuer, and A. D. Friedman. *Digital Systems Testing and Testable Design.* Computer Science Press, New York, N.Y., 1990.
M. F. AlShaibi and C. R. Kime. MFBIST: A BIST Method for Random Pattern Resistant Circuits. In *Proceedings IEEE International Test Conference*, pp. 176–185, 1996.
M. Bershteyn. Calculation of Multiple Sets of Weights for Weighted Random Testing. In *Proceedings IEEE International Test Conference*, pp. 1031–1040, 1993.

(Continued)

*Primary Examiner*—Shelly A Chase
(74) *Attorney, Agent, or Firm*—Sughrue Mion, PLLC

(57) ABSTRACT

Techniques for generating a test set for hard to detect faults is disclosed. A set of hard to detect faults is identified. A test set for the hard to detect faults is generated by using an improved automatic test pattern generator. The improved automatic test pattern generator is adapted to consider hardware overhead and test sequence lengths, the hardware overheads being incurred when each new testcube is added to the test set. Parallel and serial type test per scan built-in self test circuits designed and adapted to use the disclosed improved automatic test pattern generator are also disclosed.

35 Claims, 9 Drawing Sheets

OTHER PUBLICATIONS

P. H. B., W. H. McAnney, and J. Savir. *Built–In Test for VLSI: Pseudorandom Techniques*. John Wiley & Sons, 1987.

D. E. Goldberg. *Genetic Algorithms in Search, Optimization, and Machine Learning*. Addison Wesley, Reading, M.A., 1989.

J. Hartmann and G. Kemnitz. How to Do Weighted Random Testing for BIST. In *Proceedings IEEE International Conference on Computer–Aided Design*, pp. 568–571, 1993.

J. H. Holland. *Adaptation in Natural and Artificial Systems*. University of Michigan Press, Ann Arbor, M.I., 1975.

M. Karkala, N A. Touba, and H.–J. Wunderlich. Special ATPG to Correlate Test Patterns for Low–Overhead Mixed–Mode BIST. In *In proceedings 7γrd Asian Test Symposium*, 1998.

S. Pateras and J. Rajski. Cube–Contained Random Patterns and Their Application to the Complete Testing of Synthesized Multi–level Circuits. In *Proceedings IEEE International Test Conference*, pp. 473–482, 1991.

I. Pomeranz and S. Reddy. 3–Weight Pseudo–Random Test Generation Based on a Deterministic Test Set for Combinational and Sequential Circuits. *IEEE Trans. On Computer–Aided Design of Integrated Circuit and System*, vol. 12:1050–1058, Jul. 1993.

N. Touba and E. McCluskey. Synthesis of Mapping Logic for Generating Trans–formed Pseudo–Random Patterns for BIST. In *Proceedings IEEE International Test Conference*, pp. 674–682, 1995.

N. A. Touba and E. J. McCluskey. Altering a Pseudo–Random Bit Sequence for Scan–Based BIST. In Proceedings *IEEE International Test Conference*, pp. 167–175, 1996.

H.–J. Wunderlich and G. Kiefer. Bit–Flipping BIST. In *Proceedings VLSI Testing Symposium*, pp. 337–343, 1996.

H.–J. Wunderlich. Multiple Distributions for Biased Random Test Patterns. In *Proceedings IEEE International Test Conference*, pp. 236–244, 1988.

S. Hellebrand. B. Reeb. S. Tarnick. H.–J. Wunderlich. Pattern Generation for a Deterministic BIST Scheme. In *Proceedings IEEE International Test Conference*, pp. 88–94, 1995.

J. A. Waicukauski. E. Lindbloom. E. B. Eichelberger. O. P. Forlenza. A method for generating weighted random test patterns. IBM J. Res. Develop. vol. 33 No. 2 Mar. 1989, pp. 149–161.

G. Kiefer and H.–J. Wunderlich. Using BIST Control for Pattern Generation. In *Proceedings IEEE International Test Conference*, pp. 347–355, 1997.

J. L. Hennessy and David A. Patterson. Computer Organization and Design.

On–Chip Bus Attributes. Specification 1 Version 1.0 (OCB 1 1.0) dated Aug. 1998, On–Chip Bus Development Working Group, VSI Alliance.

B. Reeb and H.–J. Wunderlich. Deterministic Pattern Generation for Weighted Random Pattern Testing. In *Proceedings IEEE International Test Conference*, pp. 30–36, 1996.

. Savaria. B. Lague. B. Kaminska. A Fragmatic Approach to the Design of Self–Testing Circuits. Electrical Engineering Dept., Ecole Polytechnique de Montreal. In *Proceedings IEEE International Test Conference*, pp. 745–754, 1989.

H.–C. Tsai. K.–T. Cheng. C.–J. Lin. S. Bhawmik. Efficient Test–Point Selection for Scan–Based BIST. IEEE Transactions on Very Large Scale Integration (VLSI) Systems, vol. 6, No. 4, Dec. 1998.

N. Tamarapalli and Janusz Rajski. Constructive Multi–Phase Test Point Insertion for Scan–Based BIST. In *Proceedings IEEE International Test Conference*, pp. 649–658, 1996.

* cited by examiner

|  | $p_1$ | $p_2$ | $p_3$ | $p_4$ | $p_5$ |
|---|---|---|---|---|---|
| $gen(C^0)$ | 1 | 0 | X | 1 | X |
| $gen(C^1)$ | 0 | X | 1 | 1 | U |
| $gen(C^2)$ | X | 0 | U | X | X |
| $gen(C^3)$ | 0 | 0 | 1 | 0 | X |
| glob_gen | B | 0 | 1 | B | N |

| $s_{1/0}$ | $s_{1/1}$ | $s_{2/0}$ | $s_{3/1}$ | $s_{4/0}$ | $s_{4/1}$ |
|---|---|---|---|---|---|
| X | 1 | 1 | X | X | 1 |
| 1 | 0 | X | 1 | X | 1 |
| X | X | 1 | 0 | X | X |
| 1 | 0 | 1 | 1 | 1 | 0 |

GENERATORS (WEIGHT SETS)      OVERRIDING SIGNALS

FIG. 1

|  | $p_1$ | $p_2$ | $p_3$ | $p_4$ | $p_5$ |
|---|---|---|---|---|---|
| $gen(C_0)$ | 1 | 0 | X | 1 | X |
| $gen(C_1)$ | 0 | X | 1 | 1 | U |
| $gen(C_2)$ | X | 0 | U | X | X |
| $gen(C_3)$ | 0 | 0 | 1 | 0 | X |
| glob_gen | B | 0 | 1 | B | N |

| $s_{1/0}$ | $s_{1/1}$ | $s_{2/0}$ | $s_{3/1}$ | $s_{4/0}$ | $s_{4/1}$ |
|---|---|---|---|---|---|
| X | 1 | 1 | X | X | 1 |
| 1 | 0 | X | 1 | X | 1 |
| X | X | 1 | 0 | X | X |
| 1 | 0 | 1 | 1 | 1 | 0 |

GENERATORS (WEIGHT SETS)        OVERRIDING SIGNALS

FIG. 2

|  | $p_0$ | $p_1$ | $p_2$ | $p_3$ | $p_4$ | $p_5$ | $p_6$ | $p_7$ |
|---|---|---|---|---|---|---|---|---|
| $gen(C^0)$ | U | 0 | 0 | 1 | 0 | 1 | 1 | X |
| $gen(C^1)$ | 0 | U | 0 | 0 | 1 | 1 | X | 1 |

GENERATORS

FIG. 8A

|  | $D_0$ |
|---|---|
| 0 001 | 1 |
| 0 010 | 1 |
| 0 100 | 1 |
| 1 000 | 1 |
| 1 010 | 1 |
| 1 011 | 1 |

COUNTER  SCAN-COUNTER

|  | $D_1$ |
|---|---|
| 0 011 | 1 |
| 0 101 | 1 |
| 0 110 | 1 |
| 1 100 | 1 |
| 1 101 | 1 |
| 1 111 | 1 |

COUNTER  SCAN-COUNTER

WITHOUT TOGGLE F/F

FIG. 8B

|  | $D_0$ |
|---|---|
| 0 000 | 1 |
| 0 001 | 1 |
| 1 001 | 1 |
| 1 010 | 1 |

COUNTER  SCAN-COUNTER

|  | $D_1$ |
|---|---|
| 0 011 | 1 |
| 0 100 | 1 |
| 0 101 | 1 |
| 1 100 | 1 |

COUNTER  SCAN-COUNTER

WITH TOGGLE F/F

FIG. 8C

LOW HARDWARE OVERHEAD SCAN BASED 3-WEIGHT WEIGHTED RANDOM BIST ARCHITECTURES The present Application claims priority from the co-pending U.S. Provisional Patent Application Ser. No. 60/266,845 filed on Feb. 7, 2001, the contents of which are incorporated herein by reference.

I.A. FIELD

This disclosure teaches a new automatic test pattern generator for generating test patterns for testing circuits. This disclosure further teaches new serial and parallel scan based 3-weight Weighted Random Built-in Self-test (BIST) Architectures that have low hardware overhead.

I.B. BACKGROUND AND RELATED ART

I.B.1. Introduction

Built-in self-test is a test technique that gives circuits the ability to test themselves. Test vectors (also called test patterns), comprising of a set of inputs to the circuit, are applied to the circuit under test (CUT). The responses of the CUT to the applied test vectors are compared with expected responses that correspond to a good circuit. A test pattern generator (TPG) generates test patterns.

BIST can be classified into test-per-clock (parallel) and test-per-scan (scan based) according to the way in which the test vectors are applied to the CUT. In test-per-clock BIST, the test patterns that are output from TPG are directly connected to the inputs of a CUT. A new test pattern is applied at every test clock cycle. In contrast, in scan-based BIST, the test patterns generated by a TPG are applied to the CUT through a scan chain that comprises flip-flops. Therefore, in scan-based BIST, a test pattern is applied to a CUT every m+1 cycles, where m is the number of flip-flops in the scan chain.

Random test pattern generators generate test patterns randomly. Test patterns can also be generated a priori and stored in a BIST for use during testing. In contrast to built-in self-test implemented with stored pattern generators that require high hardware overhead due to memory required to store deterministic test patterns, BIST implemented with pseudo-random pattern generators, require very little hardware overhead. Linear feedback shift registers (LFSR's) and cellular automata (CA) are two commonly used pseudo-random pattern generators.

Furthermore, it has been observed that random pattern test sequences generated by LFSR's or CAR's achieve higher coverages of unmodeled faults than stored test patterns. Additionally, the number of stored test patterns is typically very short due to stringent memory size constraints. However, some circuits require prohibitively long sequences of random patterns to achieve satisfactory fault coverage.

The random pattern test length required to achieve high fault coverage is often determined by only a few hard-to-detect faults. These hard-to-detect faults are also called random pattern resistant faults because they escape detection by most random patterns. Each of these random pattern resistant faults has very low detection probability, which is defined as the probability that a randomly generated vector detects the fault. See P. H. B., W. H. McAnney, and J. Savir. *Built-In Test for VLSI: Pseudorandom Techniques*, John Wiley & Sons, 1987. The detection probability of fault f can be defined as follows:

$$\frac{\text{total number of tests for } f}{2^m}, \quad (1)$$

where m is the number of circuit inputs.

This implies that the hard-to-detect faults have many necessary input assignments that must be made for their detection. Hence, the probability that a randomly generated vector satisfies all the necessary input conditions is low.

Certain practitioners have proposed BIST techniques to improve detection probabilities of hard-to-detect faults that can be classified as extreme cases of conventional weighted random pattern testing (WRPT) BIST. See S. Pateras and J. Rajski, Cube-Contained Random Patterns and Their Application to the Complete Testing of Synthesized Multi-level Circuits, in *Proceedings IEEE International Test Conference*, pages 473–482, 1991; I. Pomeranz and S. Reddy, 3-Weight Pseudo-Random Test Generation Based on a Deterministic Test Set for Combinational and Sequential Circuits, *IEEE Trans. On Computer-Aided Design of Integrated Circuit and System*, Vol. 12:1050–1058, July 1993; and M. F. AlShaibi and C. R. Kime, Fixed-Biased Pseudo-random Built-In Self-Test For Random Pattern Resistant Circuits, in *Proceedings IEEE International Test Conference*, pages 929–938, 1994.

For further background information on (WRPT) BIST, see D. Neebel and C. R. Kime, Multiple Weighted Cellular Automata, in *VLSITS*, pages 81–86, 1994; H.-J. Wunderlich, Multiple Distributions for Biased Random Test Patterns, in *Proceedings IEEE International Test Conference*, pages 236–244, 1988; and R. Kapur, S. Patil, T. J. Snethen, and T. W. Williams, Design of an Efficient Weighted Random Pattern Generation System, in *Proceedings IEEE International Test Conference*, pages 491–500, 1994.

In the discussed techniques to improve detection probabilities of hard-to-detect faults, only three weights, 0, 0.5, 1, are assigned to each input, while various weights, e.g. 0, 0.25, 0.5, 0.75, 1.0, can be assigned in conventional WRPT. Since only three weights are used, the circuit to generate weights is simple; weight 1 (0) is obtained by fixing a signal to a 1. Likewise, weight 0 is obtained by fixing a signal to a 0. Weight 0.5 is obtained by driving a signal by an output of a pure random pattern generator, such as an LFSR. Furthermore, since only three weights are used, the size of memory required to store a weight set is also smaller than that of the conventional WRPT.

The present disclosure teaches techniques that use an improved automatic test pattern generator (ATPG) to minimize hardware overhead and test sequence length in 3-weight WRPT. In addition, this disclosure also teaches at least three improved BIST architectures that are implemented using the disclosed techniques for ATPG.

I.B.2. Notations and Definitions

In the present disclosure, the notations used in S. Pateras et al, are reused with few modifications. For detailed information on these notations, see S. Pateras and J. Rajski, Cube-Contained Random Patterns and Their Application to the Complete Testing of Synthesized Multi-level Circuits, In *Proceedings IEEE International Test Conference*, pages 473–482, 1991.

A testcube for a fault is defined as a test that has unspecified inputs. Let $C=\{c^1, c^2, \ldots, c^h\}$ denote a set of testcubes for hard-to-detect faults in a circuit under test (CUT), where $c^j=\{C_1^j, C_2^j, \ldots, C_m^j\}$ is an m-bit testcube and where m is the number inputs of the CUT. $C_i^j \in \{0, 1, X\} \forall i$ and X is don't care. Let $C^1, C^2, \ldots, C^d$ be subsets of C and let generator, $\text{gen}(C^i) \{g_1^i, g_2^i, \ldots, g_m^i\}$ (i=1, 2, ..., d)

denote m-bit tuple where $g_k^i \in \{0, 1, X, U\}$ (k=1, 2, ..., m) that is defined as follows:

$$g_k^i = \begin{cases} 1 & \text{if } c_k^j = 1 \text{ or } X \ \forall c^j \in C^i \text{ and at least one } c_k^j = 1 \\ 0 & \text{if } c_k^j = 0 \text{ or } X \ \forall c^j \in C^i \text{ and at least one } c_k^j = 0 \\ U & \text{if } \exists c_k^a = 1 \text{ and } c_k^b = 0, \text{ where } c^a, c^b \in C^2 \\ X & \text{otherwise.} \end{cases} \quad (2)$$

It should be noted that the term generator is the same as weight sets used in D. Neebel and C. R. Kime. Multiple Weighted Cellular Automata, in *VLSITS*, pages 81–86, 1994; H.-J. Wunderlich. Multiple Distributions for Biased Random Test Patterns, in *Proceedings IEEE International Test Conference*, pages 236–244, 1988; and R. Kapur, S. Patil, T. J. Snethen, and T. W. Williams. Design of an Efficient Weighted Random Pattern Generation System, in *Proceedings IEEE International Test Conference*, pages 491–500, 1994.

When $g_k^i$=U, there are testcubes in $C^i$ that conflict at input $p_k$, i.e. $\exists a, b$ such that $c_k^a$=v and $c_k^b=\bar{v}$ (v $\in\{1,0\}$) so that fixing input $p_k$ to a binary value v may make faults that require input $p_k$ to be assigned $\bar{v}$ undetectable. On the other hand, when $g_k^i$=X, input $p_k$ is not specified in any testcube in $C_i$. Hence, in this case, input $p_k$ can be fixed to any binary value without losing fault coverage. The set of inputs that are assigned binary values in testcube $c^j$ but assigned U in the corresponding position in the generator gen($C^i$) are called conflicting bits of $c^j$. FIG. 1, shows example testcubes. In the set of testcubes shown in FIG. 1(a), $c^1$ has 3 conflicting bits since inputs $p_1$, $p_3$, and $p_6$ are assigned different binary values (0 or 1) in $C^1$–$C^4$. Therefore these pins are assigned U in gen(C). On the other hand, $c^2$ has only one conflicting bit since only $p_3$ among the inputs whose corresponding bits are assigned U in gen(C) is assigned a binary value 0 in $c^2$.

a) Detection Probabilities

Let F=$\{f^1, f^2, \ldots f^n\}$ be the set of faults and C=$\{c^1, c^2, \ldots c^n\}$ be the set of testcubes. Assume that testcube $c^j$, (j=1, 2, ... n) is the only testcube for the corresponding fault, $f^j$ (j=1, 2, . . . n). Under this assumption, the detection probability of fault $f^j$ is merely $\frac{1}{2}^{m-|X^j|}$, where m is the number of inputs and $|X^j|$ is the number of inputs in testcube $c^j$ that are assigned don't care, X.

Let testcubes $c^1$, $c^2$, $c^3$, and $c^4$ shown in FIG. 1(a) be the only testcubes corresponding to faults $f^1$, $f^2$, $f^3$, and $f^4$ respectively. Testcubes $c_1$, $c_2$, $c_3$, and $c_4$ have 2, 2, 3, and 1 don't care values, respectively. Since each testcube is the only testcube for the corresponding fault, the detection probabilities of $f^1$, $f^2$, $f^3$, and $f^4$ can be respectively computed as $\frac{1}{2}^4$, $\frac{1}{2}^4$, $\frac{1}{2}^3$, and $\frac{1}{2}^5$ (note that the number of inputs, m, is 6 in this example).

As explained in Equation 2, if input $p_k$ is assigned either 1 or X in all testcubes in C and assigned 1 in at least one testcube, then it is assigned weight 1, i.e. $g_k$=1. Likewise, if input $p_k$ is assigned either 0 or X in all testcubes in C and assigned 0 in at least one testcube, then it is assigned weight 0, i.e. $g_k$=0. On the other hand, if $g_k$ is assigned a 1, then input $p_k$ can be fixed to a 1 to improve, by factor of 2, the detection probability of all faults in F that require the application of a 1 at $p_k$ for their detection. Similarly, if $g_k$ is assigned a 0, then input $p_k$ can be fixed to a 0 to improve, by factor of 2, the detection probability of all faults in F that require the application of a 0 at $p_k$ for their detection.

Since none of faults in F require the assignment of a 0 at $p_k$ for their detection, fixing $p_k$ to a 1 does not make any faults untestable. Similarly, since none of faults in F require the assignment of a 1 at $p_k$ for their detection, fixing $p_k$ to a 0 does not make any faults untestable.

In FIG. 1(a),if $p_2$ is fixed to a 0, the detection probability of faults $f^2$ and $f^4$ both of which require the assignment of a 0 at $p_2$ for their detection, increases to $\frac{1}{2}^3$ and $\frac{1}{2}^4$, respectively. In the same fashion, $p_4$ and $p_5$ can be fixed to a 1 and a 0, respectively. On the other hand, fixing other inputs $p_1$, $p_3$, and $p_6$ to a binary value make some faults untestable since testcubes for these faults have conflicting values at these inputs. For example, fixing $p_1$ to a 0 makes faults $f_3$ and $f_4$ untestable since they require the assignment of a 1 at $p_1$ for their detection.

If the four testcubes $c^1$, $c^2$, $c^3$, and $c^4$ are partitioned into two groups $C^1$=$\{c^1, c^2\}$ and $C^2$=$\{c^3, c^4\}$, inputs $p_1, p_2, p_4, p_5$, and $p_6$ in $C^1$ can respectively be fixed to 0, 0, 1, 0, and 1 and inputs $p_1, p_2, p^3$, and $p_5$ in $C^2$ to 1, 0, 0, and 0 without any conflict. Since $p_4$ is assigned X in all testcubes in $C^2$ ($c^3$ and $c^4$), $g_4^2$ is assigned X in gen($C^2$). As a consequence, gen ($C^1$)=$\{0, 0, U, 1, 0, 1,\}$ and gen($C^2$)=$\{1,0,0,X,0,U\}$. The detection probabilities of $f^1$ and $f^2$ are increased to $\frac{1}{2}$ by fixing inputs $p_1, p_2, p_4, p_5$, and $p_6$ to 0, 0, 1, 0, and 1, and the detection probabilities of $f^3$ and $f^4$ also are increased to $\frac{1}{2}$ by fixing inputs $p_1, p_2, p_3$, and $p_5$ to 1, 0, 0, and 0. In order to apply two generators gen($C^1$) and gen($C^2$), inputs $p_1, p_2, p_4$, and $p_5$ are fixed to 0, 0, 1, and 0 for the first time interval $T_1$ and then inputs $p_1, p_2, p_3$, and $p_5$ are fixed to 1, 0, 0, and 0 for the next time interval $T_2$. The procedure to compute these time intervals is described in Section IVC.

b) Importance of Generating Appropriate Testcubes

Assume that $f^1$ in FIG. 1(b) can be also detected by testcube $c'^1$=0111XX and $c'^1$ is used instead of $c^1$ to compose testcube set $C'^1$. Then, the 1 at $p_2$ of $c'^1$ conflicts with 0's at $p_2$ of the other testcube $c^2$ in $C'^1$. Hence, only $p_1, p_4, p_5$, and $p_6$ can be fixed without conflict in $C'^1$. Since only $p_1, p_4, p_5$, and $p_6$ are fixed, the detection probabilities of $f^2$, which require 0 at $p_2$ for detection, now become $\frac{1}{2}^2$—a factor of 2 decrease compared with when $c^1$ is used. If the detection probabilities of all faults in F are to be improved to $\frac{1}{2}$ or higher, then $C'^1$ should be partitioned into two smaller groups each of which has only one member, $c'^1$ and $c^2$, respectively. Hence, three generators instead of two generators, which are required when $c^1$ is used, are required when $c'^1$ is used.

In order to minimize the number of generators required, which determines hardware overhead to implement the disclosed BIST, each testcube that is added to a testcube set should be selected carefully. The newly added testcube needs to be selected such that it has the minimum number of conflicting inputs with the other testcubes that already exist in the testcube set. However, it is known that the number of all possible testcubes for hard-to-detect faults may be large in large random pattern resistant circuits. Therefore, selecting a best testcube, which has the minimum number of conflicting inputs with the other testcubes in the testcube set, from a pool of all possible testcubes for each hard-to-detect fault will require prohibitively large time complexity. Hence, for such circuits, the number of generators required may depend significantly on testcubes selected to compose the testcube sets. This implies that testcubes for hard-to-detect faults should be carefully generated to build testcube sets that need the minimum number of generators.

c) Applying Generators to Circuit Inputs

In this sub-section, the idea of applying generators to the CUT is explained for the test-per-clock BIST. This information related to the test-per-clock BIST is provided as a background for a better understanding of the disclosed techniques related to the test-per-scan BIST, which is discussed in detail in Section IVD. Let inputs $p_k$ (k=1,2, ..., m) be driven by corresponding random pattern signals $r_k$ (k=1, 2, ..., m) during purely random pattern testing. While generator gen($C^i$) is applied, input $p_k$ with $g_k^i=v$ is fixed to a binary value v by overriding random pattern signal $r_k$ by setting the corresponding overriding signal $s_{k/v}$, to a 1. The overriding signal(s) for input $p_k$ is determined by values of $g_k^i$ (i=1, 2, ..., d, where d is the number of generators). For instance, if $g_k^i$ (i=1, 2, ..., d) are always assigned X or U in all d generators, input $p_k$ is not fixed in any generator and hence no overriding signal is required for $p_k$. If $g_k^i$ are assigned a 1 or X and assigned a 1 in at least one generator, input $p_k$ should be fixed to a 1 while generator gen($C^i$) in which $g_k^i=1$ is applied. Similarly, if $g_k^i$ are assigned a 0 or X and assigned a 0 in at least one generator, input $p_k$ should be fixed to a 0 while generator gen($C^i$) in which $g_k^i=0$ is applied. If $g_k$ are assigned a 1 in gen($C^a$) (i.e. $g_k^a=1$) and 0 in gen($C^b$) (i.e. $g_k^b=0$) input $p_k$ should be fixed to a 1 while generator gen($C^a$) with $g_k^a=1$ is applied and to a 0 while generator gen($C^b$) with $g_k^b=0$ is applied.

To express the number of overriding signals and their overriding values for each input, glob_gen={$gg_1$, $gg_2$, ..., $gg_m$}, where m is the number of inputs and $gg_k$ (k=1,2, ..., m) is introduced as follows:

$$gg_k = \begin{cases} 1 & \text{if } g_k^i = 1, U \text{ or } X \, \forall \, i = 1, 2, ..., d \text{ and at least one } g_k^j = 1 \\ 0 & \text{if } g_k^i = 0, U \text{ or } X \, \forall \, i = 1, 2, ..., d \text{ and at least one } g_k^j = 0 \\ B & \text{if } \exists \, g_k^a = 1 \text{ and } g_k^b = 0 \\ N & \text{otherwise} \end{cases} \quad (3)$$

where d is the number of generators.

When $gg_k=v$ (v∈{1, 0}), only one overriding signal $s_{k/v}$ is required for input $p_k$ and when $gg_k=B$, two overriding signals $s_{k/1}$ and $s_{k/0}$ are required. Finally, when $gg_k=N$, all $g_k^i$ (i=1, 2, ..., d) are X's or U's, and input $p_k$ is always driven by random pattern signal $r_k$ during entire test application and hence no overriding signal is required for $p_k$.

FIG. 2 shows the generators and overriding signals for a circuit with 5 inputs. Since input $p_1$ is fixed to both a 1 ($g_1^0$) and ($g_1^1$ and $g_1^3$), $gg_1$ is assigned B and two overriding signals $s_{1/0}$ and $s_{1/1}$ are assigned to input $p_1$. On the other hand, since input $p_3$ is fixed to only a 1 ($g_3^1$ and $g_3^3$), $gg_3$ is assigned a 1 and only one overriding signal $s_{3/1}$ is assigned to $p_3$. Finally, since $g_5^i$ is assigned no binary value in any of generators gen($C^i$) (i=1,2,3,4), input $p_5$ is always driven by random pattern signal $r_5$ without being fixed. Hence, $gg_5$ is assigned N and no overriding signal is assigned to $p_5$. In conclusion, since two inputs, $p_1$ and $p_4$, are assigned $gg_k=B$ (k=1,4) and input $p_2$ and $p_3$ are assigned $gg_2=0$ and $gg_3=1$, respectively. The generators shown in FIG. 2 that have glob_gen={B, 0,1, B, N}, require 6 overriding signals, $s_{1/0}$, $s_{1/1}$, $s_{2/0}$, $s_{3/1}$, $s_{4/0}$, and $s_{4/1}$.

FIG. 3 shows an implementation of 3-weight WRPT circuitry for a test-per-clock BIST for the generator and overriding signals shown in FIG. 2. Signals $r_i$ (i=1,2,...,5) are connected to the outputs of a ramdom pattern generator. COUNTER in FIG. 3 selects the appropiate generator; if the content of COUNTER is i, generator gen($C^i$) is selected. Each gen($C^i$) is used to generate test patterns for $T_i$ test cycles as described above. If $g_k^i=v(v=0$ or 1), then input $p_k$ is fixed to a binary value v by overriding random pattern signal $r_k$ by setting the corresponding signal $s_{k/v}$ to a 1.

For example, while gen($C^1$)={0, X,1,1,U} is applied to the CUT, $s_{1/0}, s_{3/1}$, and $s_{4/1}$ are set to a 1 to override random pattern signals $r_1, r_3$, and $r_4$ while other overriding signals are assigned a 0. Signal ENABLE is used to enable or disable WRPT. When setting ENABLE to a 0 diables WRPT, none of the inputs are fixed and hence the random pattern generator drives all inputs. Since each state of COUNTER corresponds to a generator, the required number of bits of COUNTER is given by [$\log_2$(the number of generator)]. The overrriding signals are generated from DECODER shown in FIG. 3 with the outputs of COUNTER as inputs. The number of inputs and outputs typically determines the area required by DECODER. Hence, the number of overriding signals required to fix inputs as well as the number of generators determines the hardware overhead due to 3-weight WRPT.

The procedure described for the test-per-clock BIST are also applicable to the test-per-scan BIST (scan-based BIST) with little modification. Techniques to alter bit sequences that are scanned into a scan chain to detect hard-to-detect faults are proposed in, H.-J. Wunderlich and G. Kiefer. Bit-Flipping BIST,in *Proceedings VLSI Testing Symposium*, pages 337–343, 1996; and N. A. Touba and E. J. McCluskey, Altering a Pseudo-Random Bit Sequence for Scan-Based BIST, in *Proceedings IEEE International Test Conference*, pages 167–175, 1996 (Touba'96). Touba'96 uses the similar procedure that is used in Touba'95 to compute the mapping function that converts the complement of tests that detect any new faults into the tests for undetected faults. See N. A. Touba and E. J. McCluskey, Altering a Pseudo-Random Bit Sequence for Scan-Based BIST, *In Proceedings IEEE International Test Conference*, pages 167–175, 1996; and N. Touba and E. McCluskey, Synthesis of Mapping Logic for Generating Trans-formed Pseudo-Random Patterns for BIST, In *Proceedings IEEE International Test Conference*, pages 674–682, 1995. Since the procedure is highly dependent on the test sequence that is applied to the CUT, sometimes the complement of such tests can be tautology or in the other extreme case, the complement can have significant number of specified inputs leading to high hardware overhead. Furthermore, the whole BIST circuitry that alters the bit-sequence should be re-designed if the test sequence is changed. Karkala uses the same techniques as Touba'96 to convert pseudo-random sequences that do not detect any new faults to deterministic testcubes; See M. Karkala, N A. Touba, and H.-J. Wunderlich, Special ATPG to Correlate Test Patterns for Low-Overhead Mixed-Mode BIST, in *proceedings 7γrd Asian Test Symposium,* 1998; and N. A. Touba and E. J. McCluskey, Altering a Pseudo-Random Bit Sequence for Scan-Based BIST, in *Proceedings IEEE International Test Conference*, pages 167–175, 1996, However, unlike Touba'95, where deterministic testcubes are generated by a conventional ATPG procedure, in Karkala, deterministic testcubes are generated by a special ATPG that considers correlation among the deterministic BIST. See N. A. Touba and E. McCluskey, Synthesis of Mapping Logic for Generating Trans-formed Pseudo-Random Patterns for BIST, in *Proceedings IEEE International Test Conference*, pages 674–682, 1995; and M. Karkala, N A. Touba, and H.-J. Wunderlich, Special ATPG to Correlate Test Patterns for Low-Overhead Mixed-Mode BIST, In *proceedings 7γrd Asian Test Symposium,* 1998. H.-J. Wunderlich uses a procedure that is similar to Touba'96 but alters random patterns to deterministic pattern by flipping some bits of the random patterns. See H.-J. Wunderlich and G. Kiefer, Bit-Flipping BIST, in *Proceedings VLSI Testing Symposium*, pages 337–343, 1996; N. A. Touba and E. J. McCluskey, Altering a Pseudo-Random Bit Sequence for Scan-Based BIST, in *Proceedings IEEE International Test Conference*, pages 167–175, 1996. This technique is also highly dependent on the random pattern test sequence applied.

I.B.3. Conventional ATPG for a 3-weight WRPT BIST

In Pateras, a complete set of testcubes is generated for two-level version of synthesized circuits (the simple structure of two-level circuits makes generation of all tests possible). See S. Pateras and J. Rajski, Cube-Contained Random Patterns and Their Application to the Complete Testing of Synthesized Multi-level Circuits, in *Proceedings IEEE International Test Conference*, pages 473–482, 1991. These testcubes are partitioned into several sets such that the number of conflicting inputs of any testcube in each set is less than or equal to M and a generator is computed for each of the sets. Since the number of generators depends on testcubes in the testcube sets, as described in I.B.2(b), testcubes that have many necessary assignments are filtered out to reduce the number of generators required. This is because, if testcubes in the set have many necessary assignments, there will be more conflicting inputs and hence fewer testcubes can be placed in each testcube set leading to more generators. Hence testcubes that have fewer necessary assignments can be included in the testcube sets to be used to create generators. However, the testcubes for two-level circuits may contain testcubes that are not necessary for their multi-level synthesized circuits.

According to the experimental results reported in S. Pateras, this filtering procedure requires very high time complexity (the run time of this procedure is typically higher than that of synthesis procedure). See S. Pateras and J. Rajski, Cube-Contained Random Patterns and Their Application to the Complete Testing of Synthesized Multi-level Circuits, in *Proceedings IEEE International Test Conference*, pages 473–482, 1991. However, this procedure is believed to be necessary in this method to choose good testcubes (testcubes that has few necessary assignments) from complete set of testcubes. Since this method requires a complete set of testcubes, applying this method to large circuits, whose two-level versions are not available, may not be possible due to prohibitively high time complexity.

As is clear, the present teaching is aimed at overcoming the problems described above in general and providing improved techniques.

II. SUMMARY OF THE CLAIMED INVENTION

In the present disclosure, an improved automatic test pattern generator (ATPG) that can generate sets of testcubes that are suitable for 3-weight WRPT, is disclosed. In the disclosed techniques, testcubes in each set share the most number of common necessary input assignments, thereby generating minimal number of generators. The disclosed, improved ATPG also considers reducing overriding signals required to fix inputs according to generators as well as the number generators. The number of overriding signals is further minimized by compatibility analysis.

To realize the advantages of the teachings of the present disclosure, there is provided a method for generating a test set for hard to detect faults. The method comprises identifying a set of hard to detect faults and generating the test set for the hard to detect faults by using an automatic test pattern generator. The automatic test pattern generator comprises functionality for generators and a global generator and is adapted to consider hardware overhead and test sequence lengths. The hardware overheads are incurred when each new testcube is added to the test set.

Preferably, the test set is generated by a process further comprising calculating estimated cost using cost functions for each of the hard to detect faults, selecting a hitherto unmarked target fault from the set of hard to detect faults that has a minimum cost, generating a testcube for the selected target fault, and comparing real cost with estimated cost for the selected hard fault. If the real cost is greater than a sum total of the estimated cost plus a predetermined error and if there are still unselected faults in the set of hard to detect faults, the process is replaced with a new unselected fault. However, if no unselected faults remain in the set of hard to detect faults, a testcube having a minimum real cost is selected. If real cost is not greater than a sum total of the estimated cost plus the predetermined error, the test cube generated is retained. Marking all faults detected by the selected test cube and adding the selected test cube into a current test set are marked and current generator is updated.

Still preferably, the cost functions comprises of controllability costs, observability costs and test generation costs.

Still preferably, the number of specified inputs for the testcube are minimized by bit stripping.

Still preferably, the controllability cost for an input is calculated based on the following formulae:

$$Cv(p_k) = \begin{cases} 0 & \text{if } g_k^i = U \\ 0 & \text{if } g_k^i = v \\ w & \text{if } g_k^i = \overline{v} \text{ (where } w \gg 1) \\ 1 & \text{if } g_k^i = X \text{ and } gg_k = B \\ 1 & \text{if } g_k^i = X \text{ and } gg_k = v \\ h & \text{if } g_k^i = X \text{ and } gg_k = \overline{v} \text{ (where } h \gg 1) \\ h & \text{if } g_k^i = X \text{ and } gg_k = N \end{cases}$$

where v is a binary value, 0 or 1, X is a don't care input,
Cv ($p_k$) represents cost for an input $p_k$,
$g_k$ is an input in the current generator, and
$gg_k$ represents an input in the global generator, and
wherein
the controllability cost of each input is used to estimate a number of input conflicts and overriding signals that would be created by setting a line to a binary value v.

Still preferably, the controllability costs for internal lines is calculated based on the following formulae:

a controllability cost for an internal circuit line l in the circuit, is $$Cv(l) = \begin{cases} \min_{l_a}\{Cc(l_a)\} & \text{if } v = c \oplus i \\ \sum_{l_a} C\overline{c}(l_a) & \text{otherwise,} \end{cases}$$

where $l_a$ and l are respectively the inputs and the output of a gate with controlling value c and inversion i.

Still preferably, the test generation cost is a sum of cost to activate a specific fault on a line and a cost of propagating the fault through the line.

Another aspect of the claimed invention is a method of generating test sets for a fault list comprising hard to detect faults, the method comprising:

initializing i←0 and glob_gen←{N, N, . . . ,N};
initializing a current testcube set, $C^i$←φ;
unmarking all faults in the fault list;
initializing a current generator, gen($^{Ci}$)={X,X, . . . ,X} and j←0;
if there are no more faults in the fault list, then proceeding to the WRPT generation step;
generating a testcube $c^j$ using an ATPG;
adding the testcube $c^j$ to a current testcube set, $C^i$<-$C^i$U $c^j$;

marking faults detected by the testcube $c^j$;

setting $j \leftarrow j+1$;

if the number of conflicting inputs of any testcube in $C^i$ is greater than a positive integer M then $C^i \leftarrow C^I - c^j$, $i \leftarrow i+1$, updating the global generator, and returning to the step where a new generator is created;

if the number of conflicting inputs of any testcube in $C^i$ is not greater than M, updating gen($C^i$) and returning proceeding to the step where a new fault is considered;

generating 3-weight weighted random pattern testing (WRPT) patterns by fixing inputs or applying pure random patterns to inputs according to gen($C^i$); and running fault simulation to drop the faults that are detected by the generated 3-weight WRPT patterns.

Preferably, the method further comprises merging compatible overriding signals (parallel type test-per-scan) or reordering scan chain (serial type test-per-scan).

Another aspect of the claimed invention, is a parallel type test per scan built-in self test circuit comprising a circuit under test comprising inputs. A set of scan flip flops are connected to the inputs. Each of the scan flip flops have at least a synchronous reset (R) or a synchronous preset (S) pin. A LFSR is provided for loading random vectors that provide input to the set of scan flip-flops. A decoder provides decoder outputs, wherein the decoder outputs control the R and S pins in the scan flip-flops. The decoder comprises a functionality of a global generator. A counter provides inputs to the decoder that determine a state of the decoder outputs. An enable provides inputs for the decoder. The decoder provides overriding signals to inputs of the circuit by controlling the input to the R and S pins. The overriding signals override the random vectors based on inputs in a generator for test patterns for hard faults, said tests being generated by an automatic test pattern generator.

Preferably, the enable is provided by an AND gate, that performs an AND operation on a override enable input signal and a last scan input signal.

Still preferably, random patterns are overridden and the BIST enabled by providing a 1 input to the override enable input signal.

Still preferably, the last scan input signal is set to a 1 only at a last cycle of each scan shifting operation.

Preferably, the counter is adapted to be set to 0 initially and maintained at 0 while a specific number (T) of random patterns are input, said random patterns being modified based on the generator provided by the decoder, said counter being further adapted to be incremented and T random patterns applied with a new generator, said increment being repeated until all generators have been applied by the decoder.

Preferably, compatible overriding signals that can be merged are driven by a same output signal of the decoder, thereby reducing a number of decoder outputs.

Preferably, inversely compatible overriding signals are driven by a decoder output directly and the same decoder output after passing through an invertor.

Preferably, if a scan input is assigned a 1 by the global generator, then the corresponding scan flip-flop has an S pin.

Preferably, if a scan input is assigned a 0 by the global generator, then the corresponding scan flip-flop has an R pin.

Preferably, if a scan input is assigned both a 0 and 1 by the global generator, then the corresponding scan flip-flop has both R and S pins.

Preferably, if a scan flip-flop already has a high active S pin and whose corresponding scan input is assigned a 1 in the global generator, then a two input OR gate is inserted between the S pin and a normal present signal.

Preferably, if a scan flip-flop already has a high active R pin and whose corresponding scan input is assigned a 0 in the global generator, then a two input OR gate is inserted between the S pin and a normal present signal.

Preferably if a scan flip-flop already has a low active S pin and whose corresponding scan input is assigned a 1 in the global generator, then a two input AND gate is inserted between the S pin and a normal present signal.

Preferably, if a scan flip-flop already has a low active R pin and whose corresponding scan input is assigned a 0 in the global generator, then a two input AND gate is inserted between the S pin and a normal present signal.

Another aspect of the claimed invention is a serial type test per scan built-in self-test circuit comprising a circuit under test comprising inputs. A set of scan flip flops are connected to the inputs. A LFSR is provided for loading random vectors that provide input to the set of scan flip-flops. An AND gate and an OR gate inserted between said LFSR and the set of scan flip flops. A decoder provides two decoder output signals $D_0$ and D. The decoder output signals is input to the AND and OR gates. A generator counter that selects a generator provides inputs to the decoder. A scan counter provides input to the decoder. The state of the decoder outputs are together determined by the counter input and the scan counter input. An enable input is provided for the decoder. The decoder provides overriding signals, that override the random vectors based on tests in a generator for test patterns for hard faults. The tests are generated by an automatic test pattern generator.

Preferably, area overhead of the decoder is reduced by inserting toggle flip-flops between the two outputs of the decoder and inputs to the AND and OR gates.

Preferably, inputs from the random vector corresponding to conflicting inputs in the generator are not overridden.

Preferably, the scan_counter is adapted to increase by 1 at every positive edge of a scan clock and new values for scan inputs are scanned in serially until inputs corresponding to all pins have been scanned in. If a value in a generator is a 1, a 1 is scanned in as a scan input in a corresponding pin, instead of a value provided by the random vector. If a value in the generator is a 0, a 0 is scanned in as a scan input in a corresponding pin, instead of a value provided by the random vector. If a value in the generator is a don't care or a conflicting value, then a value in the random vector is scanned in.

Still preferably, an order of scanning is determined by using genetic algorithms, wherein a permutation of scan elements in the scan chain is used as a genetic code, and the genetic algorithm is used to determine an order of scan elements that leads to a minimum number of minterms.

Still preferably, compatible overriding signals are merged prior to applying genetic algorithms.

Still preferably, scan inputs in a group of compatible scans are rearranged to satisfy routing or load capacity.

III. BRIEF DESCRIPTION OF THE DRAWINGS

The disclosed teachings and techniques is described in more details using preferred embodiments thereof with reference to the attached drawings in which:

FIG. 1 shows examples of testcubes.

FIG. 2 shows the generators and overriding signals for a circuit with 5 inputs.

FIG. 8 shows minimization of the number of minterms using toggles.

IV. DETAILED DESCRIPTION OF THE PREFERRED EMBODIMENTS

Figure 3:
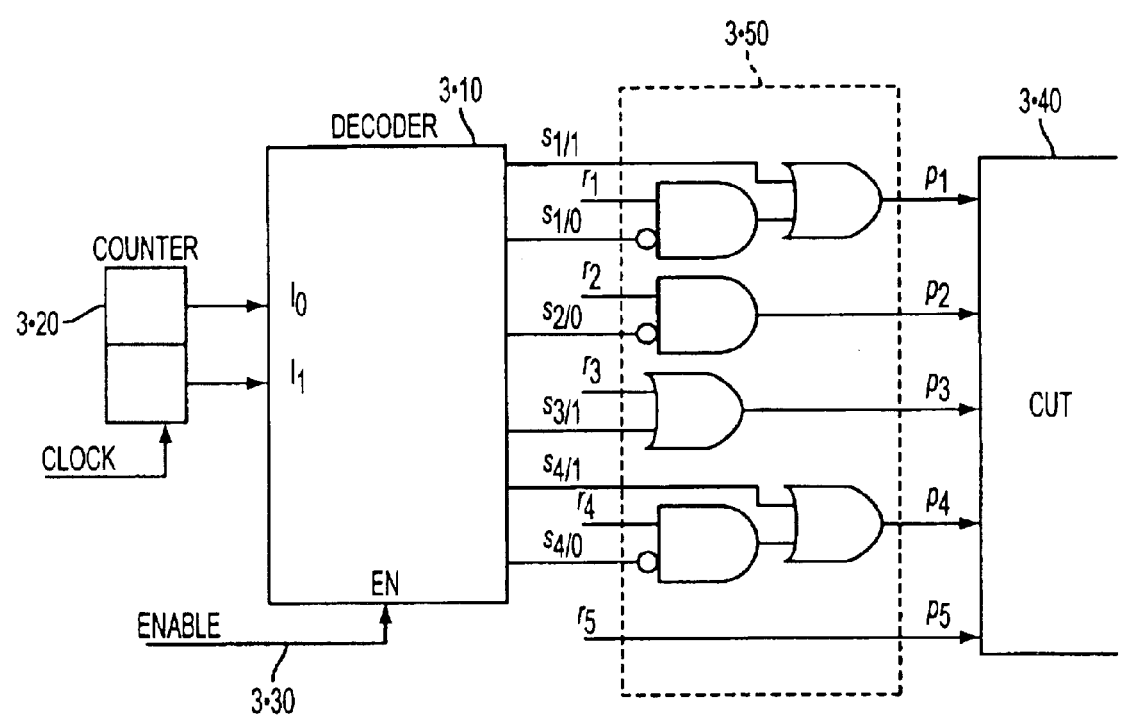
FIG. 3 shows an implementation of 3-weight WRPT circuitry for a test-per-clock BIST corresponding to FIG. 2.

IV.A. Improved ATPG for 3-weight WRPT BIST

In the disclosed improved ATPG for 3-weight WRPT BIST, first, a sequence of pure pseudo-random patterns is applied to detect a large number of random pattern testable faults. It should be noted that random pattern testable faults refer to faults that are not random pattern resistant. The sequence of pure random patterns can be considered as a special generator all of whose elements are assigned U. In contrast to S. Pateras et al, I. Pomeranz et al, and M. F. AlShaibi et al, where all testcubes are generated in advance, the disclosed improved ATPG generates suitable testcubes for hard-to-detect faults one at a time. See S. Pateras and J. Rajski, Cube-Contained Random Patterns and Their Application to the Complete Testing of Synthesized Multi-level Circuits, In *Proceedings IEEE International Test Conference*, pages 473–482, 1991; I. Pomeranz and S. Reddy, 3-Weight Pseudo-Random Test Generation Based on a Deterministic Test Set for Combinational and Sequential Circuits. *IEEE Trans. On Computer-Aided Design of Integrated Circuit and System*, Vol. 12:1050–1058, July 1993; M. F. AlShaibi and C. R. Kime. Fixed-Biased Pseudorandom Built-In Self-Test For Random Pattern Resistant Circuits, in *Proceedings IEEE International Test Conference*, pages 929–938, 1994; and M. F. AlShaibi and C. R. Kime. MFBIST: A BIST Method for Random Pattern Resistant Circuits, in *Proceedings IEEE International Test Conference*, pages 176–185, 1996.

Since only suitable testcubes are generated, procedure to filter out testcubes that have many necessary assignments is not required in the disclosed technique. Generated testcubes are placed into testcube set $C^i$, called current testcube set, until placing any testcube into $C^i$ makes the detection probability of a fault lower than a predefined threshold $\frac{1}{2}^M$, i.e. the number of conflicting inputs of the testcube in $C^i$ that has the most number of conflicting inputs becomes greater than M. Upon the generation of a testcube set $C^i$, a new current testcube set $C^{i+1}$ is created into which the testcubes generated later are placed. Whenever a testcube is placed into $C^i$, generator gen($C^i$) is updated according to Equation 2. In order to place as many testcubes into each testcube set as possible (to minimize the number of generators) each testcube is generated by the disclosed improved ATPG, taking all testcubes in the current testcube set into consideration. It should be noted that the disclosed technique can be considered to be an improvement over PODEM, a conventional ATPG technique. For more details on PODEM, see P. Goel, An Implicit Enumeration Algorithm to Generate Tests for Combinational Logic Circuits, *IEEE Trans. on Computers*, Vol. C-30(3), March 1981.

As mentioned in I.B.2(c), the hardware overhead for implementing 3-weight WRPT BIST is determined by not only the number of generators but also the number of overriding signals that are expressed by glob_gen. Hence, in order to minimize hardware overhead, the disclosed technique attempts to minimize the number of overriding signals. The global generator glob_gen is updated after each testcube set, $C^i$, is finalized, i.e. when adding any testcube to $C^i$ makes the number of conflicting inputs of any testcube greater than the predefined M. The disclosed improved ATPG also minimizes the number of overriding signals by taking current glob_gen into consideration.

Controllability, observability, and test generation cost are defined to guide the disclosed improved ATPG to generate a testcube that has the smallest number of conflicting inputs with testcubes in the current testcube set and that requires the smallest number of overriding signals.

The controllability cost of each line is used to guide the disclosed improved ATPG when there are more than one possible backtrace paths for line justification. The controllability cost of input $p_k$, $Cv(p_k)$, is defined by considering the generators gen($C^i$) of the current testcube set and the current glob_gen as follows:

$$Cv(p_k) = \begin{cases} 0 & \text{if } g_k^i = U \\ 0 & \text{if } g_k^i = v \\ w & \text{if } g_k^i = \bar{v} \text{ (where } w \gg 1) \\ 1 & \text{if } g_k^i = X \text{ and } gg_k = B \\ 1 & \text{if } g_k^i = X \text{ and } gg_k = v \\ h & \text{if } g_k^i = X \text{ and } gg_k = \bar{v} \text{ (where } h \gg 1) \\ h & \text{if } g_k^i = X \text{ and } gg_k = N \end{cases} \quad (4)$$

where v is a binary value, 0 or 1.

The purpose of the controllability cost of each input is to estimate the number of input conflicts and overriding signals that would be created by setting line 1 to a binary value v. If $g_k$=U, the current testcube set already contains testcubes that conflict at input $p_k$. Hence, assigning any binary value to $p_k$ does not cause any more adverse effect. Hence, $Cv(p_k)$=0. When $g_k$=1 (0), a testcube whose input $p_k$ is assigned a 1 (0) does not cause conflict with any testcube in the current testcube set. Hence, $Cv(p_k)$=0. If $g_k$=1, all testcubes in the current testcube set are assigned only 1 or X at input pk. Likewise, if $g_k$=0, all testcubes in the current testcube set are assigned only 0 or X at input pk. Hence, a testcube whose input $p_k$ is assigned to the opposite value 0 (1) causes a conflict at input $p_k$ with other testcubes in the current testcube set. Hence, this assignment clearly causes a conflict and hence high cost $Cv(p_k)$=w is assigned.

A new overriding signal can be added to the BIST TPG when input $p_k$ whose $g_k^i$ is currently X (hence $p_k$ is not specified in any testcube in the current testcube set) is assigned a binary value. Assigning input $p_k$, whose $g_k^i$ is currently X to a binary value v, changes the current value of $g_k$ X to a binary value v. This can require an additional overriding signal to the BIST depending on the current value of $gg_k$. If $gg_k$ is currently B, two overriding signals, $s_{k/1}$ and $s_{k/0}$, are already assigned to input $p_k$. Hence, assigning $p_k$ to any binary value does not require any additional overriding signal. In case $gg_k$ is currently assigned a binary value v, assigning the same value v to $p_k$ requires no additional overriding signal. Even though the two above mentioned cases do not require any additional overriding signal or cause any input conflict, assigning v to $p_k$ may conflict with a testcube generated later that assigns $\bar{v}$ to $p_k$. Hence, assigning a binary value to $p_k$ is a potential cause of later conflict and assigned a small cost, 1. If currently $gg_k$ is N and $g_k{}^i$=X, any testcube that requires input $p_k$ to be assigned a binary value v, creates one more overriding signal, $s_{k/v}$, for input $p_k$. If currently $gg_k=\bar{v}$ and $g_k{}^i$=X, any testcube that requires input $p_k$ to be assigned the binary value v changes the value of $gg_k$ to B adding one more overriding signal, $s_{k/v}$, for input $p_k$. For these two cases, controllability of the input is h, where h is a constant that reflects the cost for adding an overriding signal.

The controllability costs for internal circuit line 1 in the circuit, is computed as follows.

$$Cv(l) = \begin{cases} \min_{l_a} \{Cc(l_a)\} & \text{if } v = c \oplus i \\ \sum_{l_a} C\bar{c}(l_a) & \text{otherwise,} \end{cases} \quad (5)$$

where $1_a$ and 1 are respectively the inputs and the output of a gate with controlling value c and inversion i. It should be noted that, the above computation of controllability cost is similar to testability measures used in Goldstein et al. See L. H. Goldstein and E. L. Thigpen. SOAPY: Sandia Controllability/Observability Analysis Program. In *Proceedings IEEE-ACM Design Automation Conference*, pages 190–196, 1980.

Note that the controllability cost for circuit 1, Cv(1), is the minimum cost to set line 1 to v. In other words, if 1 can be set to v by setting only one of its input to binary value v', i.e., v=v'⊕i and v' is the controlling value of the gate that drives 1, and input $l_{min}$ of 1 has the minimum cost function $Cv'(l_{min})$ among 1's inputs, then Cv(1) is defined as $Cv'(l_{min})$. However, if there are reconvergent fanouts in the circuit, then it may not be possible to set 1 to v by setting $l_{min}$ to v' due to conflict with other objectives. In that case, the disclosed improved ATPG selects other input of 1, which has higher cost function than $l_{min}$, to satisfy the object of setting line 1 to v. Hence, the actual cost of setting line 1 to v can be greater, but cannot be less, than Cv(1).

During test generation, all gates whose output values are currently unknown and at least one of whose gate inputs has the fault effect belong to D-frontier. For more background information on D-frontier, See P. Goel. An Implicit Enumeration Algorithm to Generate Tests for Combinational Logic Circuits, *IEEE Trans. on Computers*, Vol. C-30(3), March 1981. In the disclosed improved ATPG, a gate that is likely to create a minimum number of conflicts and needs minimum amount of additional TPG hardware to propagate the fault effect at its input is selected from D-frontier repeatedly, until the fault effect reaches one or more primary outputs.

The observability cost function described below serves as a selection criterion to achieve this objective. The observability cost functions are recursively computed from primary outputs to primary inputs. The observability cost of line 1 is given by $$O(l) = \begin{cases} \min_{l_o} \{O(l_0)\} & \text{if } l \text{ is a fanout stem with branches } l_o \\ \sum_{l_a} C\bar{c}(l_a) + O(l_o) & \text{otherwise,} \end{cases} \quad (6)$$

where in the latter case $l_o$ is the output of gate with input 1 and $l_a$ are all inputs of $l_o$ other than 1. The observability cost of line 1 is also the minimum cost to propagate a value at line 1 to one or more primary outputs. Hence, just like in the controllability cost, if the circuit has reconvergent fanouts, then the actual cost to propagate a value at line 1 to one or more primary outputs can be higher than, but not less than, the observability cost of line 1, O(1).

The disclosed improved ATPG will now be described with reference to an example related to the stuck at fault model. In order to generate a testcube to detect a stuck-at-$\bar{v}$ (s-a-$\bar{v}$) at line l, first the fault is be activated by setting line 1 to v. The cost to activate l s-a-$\bar{v}$ is Cv(1). Then, the activated fault effect is propagated to one of more primary output. The cost to propagate the activated fault effect at line 1 is O(1). Hence, the test generation cost to generate a testcube for l s-a-$\bar{v}$ is defined as the sum of two cost functions;

$$Tv(l)=Cv(l)+O(1). \quad (7)$$

Since the controllability cost and observability cost are defined as the minimum possible costs, the test generation cost Tv(l), which is merely the sum of two cost functions, Cv(l) and O(l), is also the minimum cost to generate a testcube to detect a stuck-at-$\bar{v}$ and hence the actual cost to generate a testcube to detect a stuck-at-$\bar{v}$ is always greater than or equal to its test generation cost function Tv(l). Since testcubes generated by the disclosed improved ATPG are often over specified, a few bits that are assigned binary values by the disclosed improved ATPG can be replaced by don't cares while ensuring the detection of the target fault. Testcubes with fewer specified inputs have fewer conflicting inputs with testcubes already in the current testcube set so that more testcubes can be placed in a testcube set. Whenever a testcube is generated, inputs that are assigned binary values are ordered according to the cost of assigning each input to its binary value. The value assigned to each of these inputs is flipped in this order. If the target fault can be still detected after an input is flipped, the value assigned to the inputs is replaced by a don't care. This procedure is called bit stripping.

If a circuit has any reconvergent fanout, an input assignment required to satisfy some objectives may conflict with that required to satisfy other objectives, causing the disclosed improved ATPG to select an objective or backtrace path with high cost. Hence, in circuits with reconvergent fanouts, the actual cost of the testcube generated for a fault may be much higher than the cost of the fault given by the estimate test generation cost function shown in Equation 7.

To prevent adding such testcubes to the current testcube set, if the actual cost of a generated testcube is higher by a certain number (say, 100) than the estimate test generation cost of the fault, the generated testcube is discarded. Test generation is then carried out for alternative target faults until a testcube is found for a fault whose actual cost is close to the estimate test generation cost of the fault or all faults in the fault list are tried. However, even in the worst case where all faults in the fault list need to be tried, generating testcubes is required only for few faults. The estimate test generation cost of a fault is always an optimistic approximate of the actual cost for the fault in the sense that the actual cost of any testcube for the fault cannot be less than the estimate test generation cost. Hence, if the estimate test generation cost of a fault is greater than the actual cost of the testcube that has the minimum actual cost among the testcubes that have been generated to be added to the current set but discarded due to high actual cost, then the actual cost of any testcube for the fault cannot be less than the current minimum actual cost and hence generating a testcube for the fault is not required. If testcubes for all faults in the fault list have very high actual cost, then the testcube that has the minimum actual cost is chosen to be a new member of the current testcube set.

Figure 4:
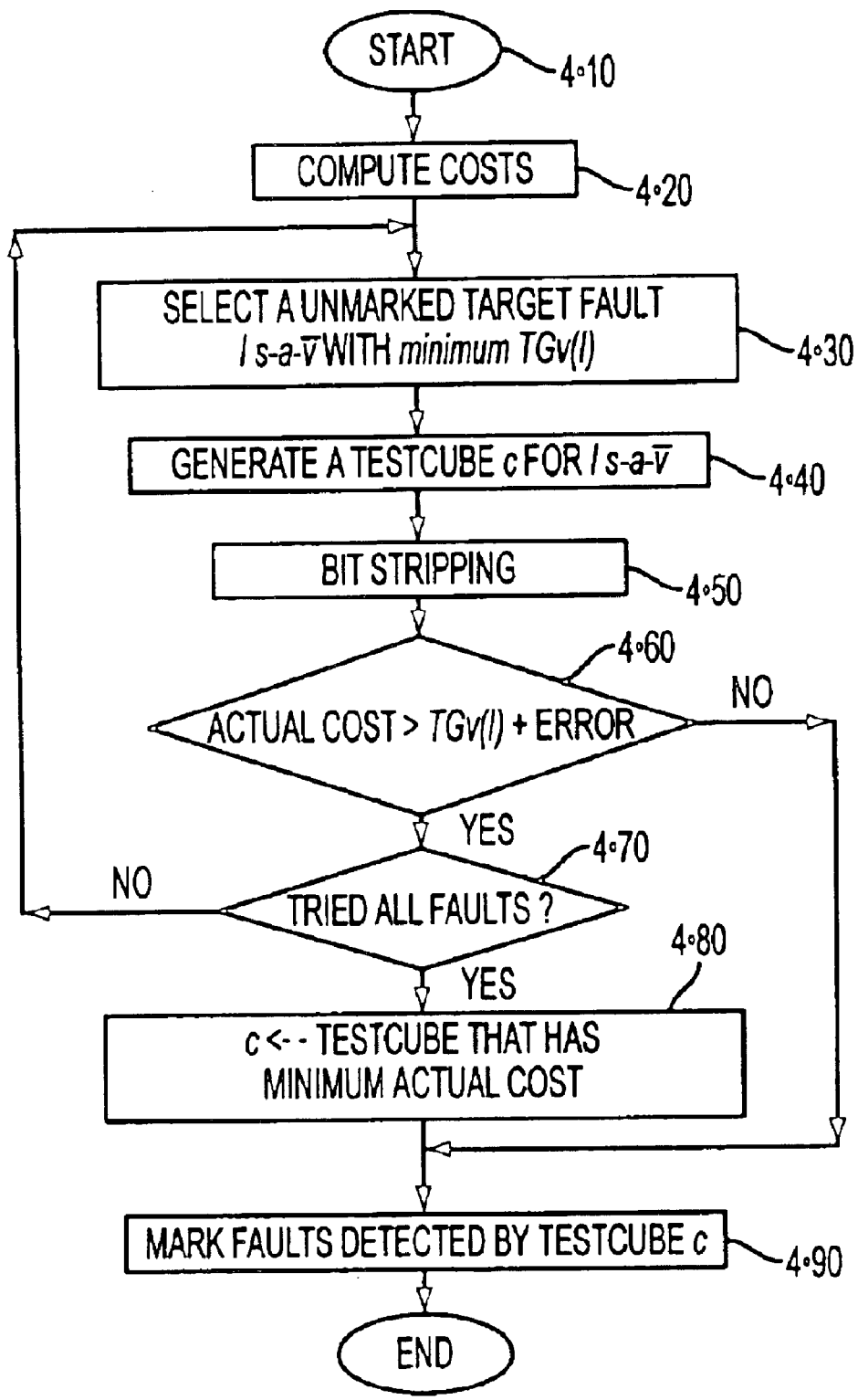
FIG. 4 shows a flowchart illustrating the disclosed improved ATPG technique.

A flowchart showing a preferred embodiment of the disclosed improved ATPG is shown in FIG. 4.

In 4.20 costs for all the hard-to-detect faults are computed. In 4.30 a hitherto unselected target fault from the set of hard to detect faults that has the minimum cost is selected. A testcube is generated in 4.40 for the selected target fault. In 4.50, bit stripping is performed, In 4.60 real cost is compared with estimated cost. If real cost is greater than estimated cost plus a predetermined error, in 4.60 the process returns to 4.30 if there are still unselected faults. A testcube that has a minimum real cost is chosen in 4.80 if no unselected faults remain. If real cost is not greater than estimated cost plus a predetermined error in 4.60, the test cube generated in 4.40 is retained as the selected test cube. Finally, all faults detected by the selected test cube are marked in 4.90.

As all other ATPG algorithms, the conventional PODEM also has non-polynomial worst case time complexity and hence may fail to generate a test for some faults or identify their redundancy due to backtracks that exceeds a predefined backtrack limit. These faults are called aborted faults. Experiments were conducted to check whether backtracks increase due to the new cost functions used by the disclosed improved ATPG. For comparison, a PODEM that used the cost function defined in L. H. Goldstein was implemented to reduce backtracks generate testcubes for the same faults. See L. H. Goldstein and E. L. Thigpen, SCOAP: Sandia Controllability/Observability Analysis Program, in *Proceedings IEEE-ACM Design Automation Conference*, pages 190–196, 1980. When the same backtrack limit, 500, was used, the numbers of aborted faults in this case were close to those aborted by the disclosed improved ATPG for all circuits. This implies that the large number of backtracks in some circuits results from the limitation of PODEM algorithm, on which the disclosed ATPG is an improvement, rather than due to the new cost functions.

If test generation for a fault is aborted, a further improvement comprised invoking a SAT-based ATPG, which is implemented based on TEGUS, to find necessary input assignments for the aborted fault. For more background information on TEGUS, see P. Stephan, R. K. Brayton, and A. L. Sangiovanni-Vincentelli. Combinational Test Generation Using Satisfiability. *IEEE Trans. on Computer-Aided Design of Integrated Circuit and System*, Vol. 15(9), September 1996.

The necessary input assignments found by the SAT-based ATPG is further processed to find more necessary input assignments by conflict analysis. During conflict analysis, each input $p_k$ that is not assigned a necessary value to detect the fault by the SAT-based ATPG is set to a 0 first and the 0 at input $p_k$ is propagated into internal circuit lines. If a fault effect (D or $\overline{D}$) propagates to any of primary outputs after the propagation process, the cube that is composed of the current values assigned at primary inputs, which are assigned by the SAT-based ATPG and conflict analysis, is a testcube for the fault. Otherwise, if the assignment of a 0 at input $p_k$: (1) blocks all x-paths in the circuit, (2) removes all gates from the D frontier, or (3) assigns a binary value v to the fault site that is the same as the fault value, s-a-v, then input $p_k$ must be assigned a 1 to detect the fault i.e., the 1 is the necessary value at input $p_k$ to detect the fault. For more background information, see M. Abramovici, M. A. Breuer, and A. D. Friedman. *Digital Systems Testing and Testable Design*. Computer Science Press, New York, N.Y., 1990.

Conflict analysis is repeated for the assignment of a 1 at input $p_k$. If the assignment of both 0 and 1 at the input causes at least one of the three conflict conditions described above, the fault is redundant. Since necessary values for more inputs can be identified after the necessary input value for an input is assigned to the input, conflict analysis is repeated until no necessary input assignment is further identified. The computed necessary input assignments for the aborted fault are passed to the disclosed improved ATPG, to finally generate a testcube for the fault.

IV.B. Merging Overriding Signals

After testcubes for all hard-to-detect faults are generated, overriding signals are built by expanding the final glob__gen as shown in I.B.2(c). If $gg_k$ is assigned a 1, an OR gate is assigned to input $p_k$. Input $p_k$ is fixed to a 1 by setting an input of the OR, $s_{k/1}$, to a 1 while generator gen($C^i$) with $g_k^i=1$ is applied as shown in FIG. 3. Similarly, if $gg_k$ is assigned a 0, an AND gate is assigned to input $p_k$. Input $p_k$ is fixed to a 0 by setting an input of the AND, $s_{k/0}$, to a 1 while generator gen($C^i$) with $g_k^i=0$ is applied. If $g_k^i$ is assigned U in generator gen($C^i$), there are input conflicts in testcube C. Hence, input $p_k$ cannot be fixed and all overriding signals assigned to input $p_k$ should be set to a 0 while gen($C^i$) is applied. If $gg_k$ is assigned B, an OR and a AND gate are assigned to input $p_k$. Input $p_k$ is driven by the OR gate that is driven by a corresponding overriding signal $s_{k/1}$ and the AND gate that is driven by the other overriding signal $s_{k/0}$ (see overriding signals $s_{l/0}$ and $s_{1/1}$ in FIG. 3). When input $p_k$ needs to be fixed to a 1 (while gen($C^a$) with $g_k^a=1$ is applied), the overriding signal $s_{k/l}$ is set to a 1 and the value of $s_{k/0}$ is don't care at this time. In contrast, when $p_k$ is required to be fixed to a 0 (while gen($C^b$) with $g_k^b=0$ is applied), $s_{k/l}$ must be set to a 0 not so as to override the value at the output of the AND gate, 0. If $g_k^i$ is assigned X in generator gen(Ci), the state of the corresponding overriding signal s and/or $s_{k/\overline{v}}$ is don't care X while gen($C^i$) is applied. However, if $g_k^i$ is assigned U in generator gen($C^i$), input $p_k$ must be assigned both 1 and 0. Hence, the corresponding overriding signal $s_{k/v}$ and/or $s_{k/\overline{v}}$ should be assigned 0's not to override random pattern signal $r_k$.

Any two overriding signals $s_{a/y}$ and $s_{b/z}$ (a≠b) and y, z ∈ {0,1,X} are not compatible if $s_{a/y}$='v and $s_{b/z}=\overline{v}$ (v∈{0, 1}) in any generator. Otherwise, $s_{a/y}$ and $s_{a/z}$ are compatible. Compatible overriding signals can be merged into one overriding signal. For example, in FIG. 2, $s_{1/1}$ and $s_{3/1}$ are not compatible because to apply generator gen($C^1$), $s_{1/1}$ should be set to a 0 while $S_{3/1}$ to a 1. On the other hand, $s_{1/0}$ and $s_{2/0}$ are compatible.

Considering inverse relation can expand the definition of compatible inputs. Note that, for example in FIG. 2, in every generator where overriding signal $s_{1/1}$ is assigned v (v=0 or 1), overriding signal $s_{3/1}$ is assigned $\overline{v}$ or X. Hence, if overriding signal $s_{3/1}$ is inverted before it drives the two input OR gate that fixes input $p_3$ while $s_{1/1}$ drives the two input OR gate that fixes input $p_1$ directly, then $s_{3/1}$ and $s_{1/1}$ can be merged. Such overriding signals $s_{a/y}$ and $s_{b/z}$ (a≠b) are said to be inversely compatible. Finding minimum number of overriding signals can be formulated as maximum independent set problem. For more background information, see J. A. Bondy and U. S. R. Murty. *Graph Theory with Applications*. American Elsevier Publishing Co. Inc., New York, N.Y., 1982.

Figure 5:
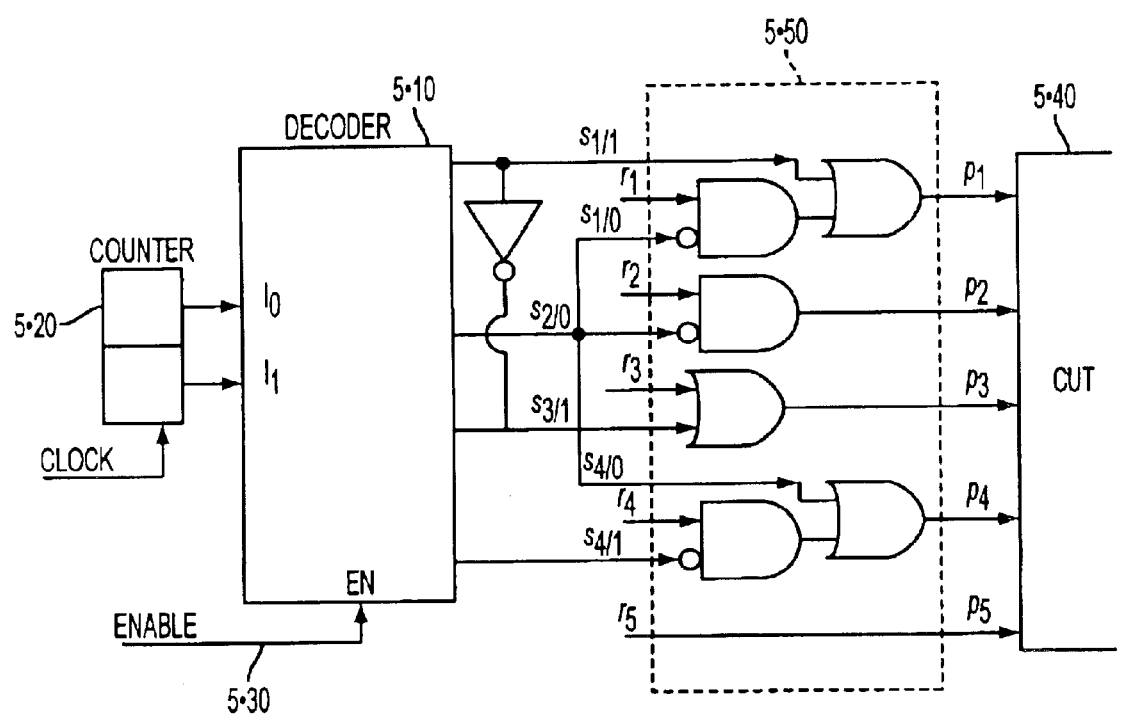
FIG. 5 shows a Test-per-clock BIST implementation with merged overriding signals.

FIG. 5 shows an implementation for the generators and overriding signals shown in FIG. 2 where compatible overriding signals are merged. Note that while DECODER of the BIST implementation for the same generators and overriding signals shown in the conventional architecture shown in FIG. 3 has 6 outputs, DECODER of the implementation corresponding to the disclosed technique has only 3 outputs. Compatible overriding signals $s_{1/0}$, $s_{2/0}$, and $s_{4/1}$ are merged and driven by the same output of DECODER. $s_{3/1}$, which is inversely compatible with $s_{1/1}$, is driven by the same DECODER output as $s_{1/1}$ through an inverter. $s_{4/1}$, which has no compatible or inversely compatible input, is not merged with any other input.

Overall algorithm for the disclosed improved ATPG design is outlined below.

1. i←0, glob_gen←{N,N, . . . ,N}.
2. Initialize the current testcube set, $C^i$←φ, unmark all faults in the fault list, and generator, gen($C^i$)={X,X, . . . ,X}. j←0.
3. If there are no more faults in the fault list, then go to 6. Generate a testcube $c^j$ by the disclosed improved ATPG.
4. Add the testcube $c^j$ to the current testcube set, Cl {0? U c'. j←j+1. Mark faults detected by testcube $c^j$.
5. If the number of conflicting inputs of any testcube in $C^i$ is greater than M (M is a positive integer), then $C^i$←$C^i$ $c^j$, i←i+1, update glob_gen, and go to Step 2. Otherwise, update gen($C^i$) and go to Step 3.
6. Generate 3-weight WRPT patterns by fixing inputs or applying pure random patterns to inputs according to gen($C^i$). Run fault simulation to drop the faults that are detected by generated 3-weight WRPT patterns.
7. Merge compatible overriding signals.

IV.C. Test Sequence for Each Generator

Assume that an m-bit LFSR is used to apply random patterns to a CUT with m inputs. The LFSR has been known to be the most cost-effective random pattern generator. In this sub-section the pattern length required to detect all faults in $F_i$ when an LFSR is used to generate random patterns is computed. The escape probability of fault f is the probability that fault f will not be detected even after t test patterns are applied. For more background information on escape probability, see P. H. B., W. H. McAnney, and J. Savir. *Built-In Test for VLSI: Pseudorandom Techniques.* John Wiley & Sons, 1987. If repetition of any test pattern is not allowed, e.g., t test patterns, where t<$2^m$, are generated by an m stage LFSR that has primitive polynomial, the escape probability of fault f for t test patterns is given by $$ep_f(t) = \left(1 - \frac{V_f}{2^m}\right)\left(1 - \frac{V_f}{2^m - 1}\right)\left(1 - \frac{V_f}{2^m - 2}\right), \ldots , \quad (8)$$

$$\left(1 - \frac{V_f}{2^m - (t-1)}\right), t \geq 1,$$

where $V_f$ is the number test vectors for fault f. If $2^{im}$>>t, Equation 8 can be approximated as follows:

$$ep_f(t) \approx \max\left(1 - \frac{V_f}{2^m}\right)^t. \quad (9)$$

The random pattern length required to detect fault f with escape probability no larger than ε is given by $$T = \left\lceil \frac{\log \varepsilon}{\log(1 - V_f/2^m)} \right\rceil. \quad (10)$$

Let $F^i=\{f^1, f^2, \ldots f^n\}$ be faults which are detected by testcubes in testcube set $C^i$. To detect all faults in $F_i$, a random sequence long enough to detect the fault with the lowest detection probability should be applied. If a new pattern is generated each cycle, then T patterns can be generated in a time interval T. Hence time interval T and test sequence length T can be used interchangeably. The length of such a sequence, $T_{max}$, is given by $$T_{max}(C^i) = \max_{f^j} \in F_i \left\lceil \frac{\log \varepsilon}{\log(1 - V_{f^j}/2^m)} \right\rceil. \quad (11)$$

Since the number of conflicting bits for all testcubes is greater than or equal to M, the detection probability of any fault is less than or equal to $\frac{1}{2}^M$. Hence, Equation 11 can be rewritten as follows:

$$T_{max} = \left\lceil \frac{\log \varepsilon}{\log(1 - 1/2^M)} \right\rceil. \quad (12)$$

According to the exhaustive experiments performed, when ε less than 0.2 is used, all $2^m$ M-bit patterns could be applied to any M inputs. Table 1 shows the pattern length $T_{max}$ required for different M's when ε=0.2 and 0.1.

TABLE 1

| | Pattern Length for ε = 0.1, 0.2 | |
|---|---|---|
| ε | M | Test Length |
| 0.2 | 3 | 12 |
| 0.2 | 6 | 102 |
| 0.2 | 9 | 823 |
| 0.2 | 12 | 6591 |
| 0.1 | 3 | 17 |
| 0.1 | 6 | 146 |
| 0.1 | 9 | 1177 |
| 0.1 | 12 | 9430 |

In the case that the clock for $T_{max}$ is generated by dividing the test clock by powers of 2 for simple hardware, the interval can be obtained by computing the smallest power of 2 that is greater than or equal to $T_{max}$.

If all $2^M$ distinct M-bit patterns are applied to M conflicting inputs, while the other inputs are fixed according to generator gen($C^i$) during time interval T, all faults in $F_i$ are guaranteed to be detected. The patterns to satisfy the above condition can also be generated by test pattern generators designed for pseudo exhaustive testing. Syndrome-driver counter, constant-weight counter, combined LFSR/SR, combined LFSR/XOR, and condensed LFSR are test patterns that can generate such patters. For further background information on constant-weight counter, see D. T. Tang and L. S. Woo, Exhaustive Test Pattern Generation with Constant Weight Vectors. *IEEE Trans. on Computers*, Vol. C-32(12), December 1983; and E. J. McCluskey, Verification Testing—A Pseudoexhaustive Test Techniques, *IEEE Trans. on Computers*, Vol. C-33(6), June 1984. For further background information on combined LFSR/SR, see D. T. Tang and C. L. Chen, Logic Test Pattern Generation Using Linear Code, *IEEE Trans. on Computers*, Vol. C-33(9), September 1984. For further background information on combined LFSR/XOR, see S. B. Akers, On the Use of Linear Sums in Exhaustive Testing, in *Proceedings IEEE International Conference on Fault-Tolerant Computing*, pages 148–153, 1985. For further background information on condensed LFSR, see L.-T. Wang and E. J. McCluskey, A New Condensed Linear Feedback Shift Register Design for VLSI/System Testing, in *Proceedings IEEE International Conference on Fault-Tolerant Computing*, pages 360–365, 1984; and L.-T. Wang and E. J. McCluskey. Condensed Linear Feedback Shift Register (LFSR) Testing—A Pseudoexhaustive Test Techniques. *IEEE Trans. on Computers*, Vol. C-35(4), April 1986.

IV.D. Application to Test-Per-Scan BIST

This sub-section discusses preferred embodiments of improved test-per-scan BIST circuit architecture. Contrary to Touba'96 and Wunderlich et al, since the disclosed BISTs generate random sequences during each period T that are long enough to apply all $2^M$ M-bit patterns to conflicting inputs (see IV.C), fault coverage achieved by the disclosed BISTs is not dependent on the random pattern sequences generated. See N. A. Touba and E. J. McCluskey, Altering a Pseudo-Random Bit Sequence for Scan-Based BIST, in Proceedings *IEEE International Test Conference*, pages 167–175, 1996; and H.-J. Wunderlich and G. Kiefer. Bit-Flipping BIST, In *Proceedings VLSI Testing Symposium*, pages 337–343, 1996. Two different types of test-per-scan BISTs are disclosed. Preferred embodiments embodying these two architectures are discussed herein.

IV.D.1. Parallel Type Test-Per-Scan BIST

Figure 6:
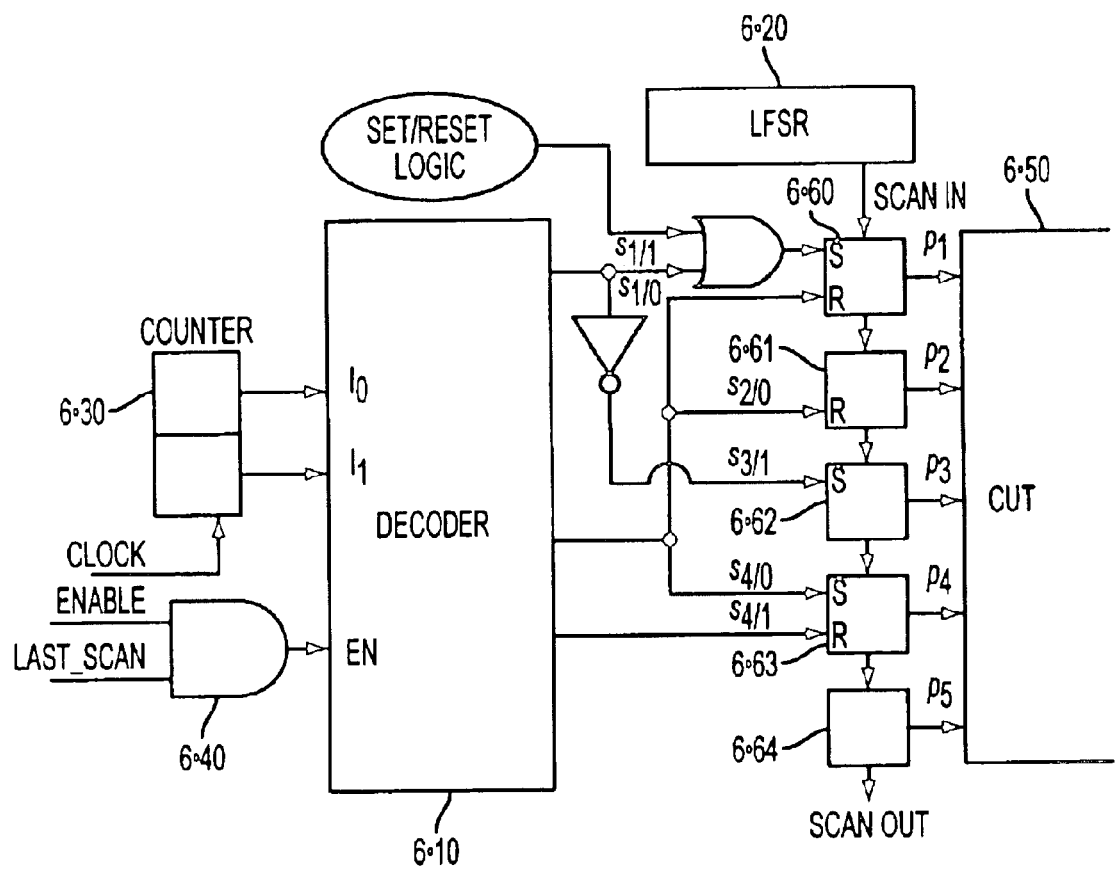
FIG. 6 shows a preferred embodiment of the disclosed parallel type test-per-scan BIST circuit with 3-weight WRPT.

The first type of test-per-scan BIST, which is called the parallel type test-per-scan BIST, has some similarities to the test-per-clock BIST. FIG. 6, shows an implementation of parallel type test-per-scan BIST embodying the disclosed techniques. The same example circuit for the generators and overriding signals shown in FIG. 2 is used in the FIG. 6. Like the test-per-clock BIST, the overriding signals are generated from DECODER 6.10 with the outputs of COUNTER 6.30 as inputs. However, unlike the test-per-clock BIST where overriding signals drive corresponding AND and OR gates, in parallel type of test-per-scan BIST, the overriding signals drive S (synchronous preset) and R (synchronous reset) pins of scan elements in the scan chain 6.60–6.64. Hence, in the parallel type test-per-scan BIST, scan elements $h_i$ (i 1,2, . . . ) that do not have S or R pins should be replaced by scan elements that have an S and/or R if scan input $p_i$, which is driven by scan element $h_i$, is assigned a 1, 0, or B in the global generator glob_gen. If $gg_i=1$, then scan element $h_i$ is replaced by a scan element 6.62 with a S pin. If $gg_i=0$, then scan element $h_i$ is be replaced by a scan element 6.61 with an R pin. And finally, if $gg_i=B$, then scan element $h_i$ is replaced by a scan element 6.63 with both an S and R pins. If a scan element already has a high active S pin whose corresponding scan input is assigned a 1 in at least one generator, then a two input OR gate or a two input AND gate if the S pin is low active—should be inserted between the S pin and the normal preset signal. Likewise, if a scan element already has a high active R pin whose corresponding scan input is assigned a 0 in at least one generator, then a two input OR gate or a two input AND gate if the R pin is low active—should be inserted between the R pin and the normal reset signal. For example, the scan element 6.60 driving $p_1$ of the circuit shown in FIG. 6 had an S pin in the original circuit, which is controlled by SET/PRESET logic during the circuit's normal operation, and hence an OR gate is inserted between overriding signal $s_{1/0}$ and the S pin of the scan element 6.60. The LFSR 6.20 generates the random test patterns.

Another difference between the test-per-clock BIST and the parallel type test-per-clock BIST is that while input pin EN of DECODER 3.10 is directly driven by ENABLE 3.30 in the test-per-clock BIST, in the parallel type test-per-clock BIST, EN of DECODER 6.10 is driven by a two input AND gate 6.40 whose two inputs are driven by LAST_SCAN and ENABLE signals, respectively. The test-per-scan BIST requires n test clocks, where n is the number of scan elements in the scan chain, to scan a test vector into a scan chain during a scan shift operation. Then the scan elements in the scan chain are configured in their normal mode to capture the response to the scanned in test vector. LAST_SCAN is set to a 1 for only one cycle at the end of each scan shift operation and set to a 0 during all other cycles. Hence, DECODER 6.10 is enabled only at the end of a scan shift operation when a vector, which is generated by a random pattern generator, is fully loaded into the scan chain. When DECODER is enabled, the overriding signals modifies the random vector, which is loaded into the scan chain, by activating S and/or R pins of the scan elements that are assigned a binary value in the generator that is currently being applied.

The area overhead of a parallel type test-per-scan BIST is close to that of a test-per-clock BIST. Also the merging technique to reduce overriding signals, which is described in IV.B, is applicable to the parallel type test-per-scan BIST.

IV.D.2. Serial Type Test-Per-Scan BIST

Figure 7:
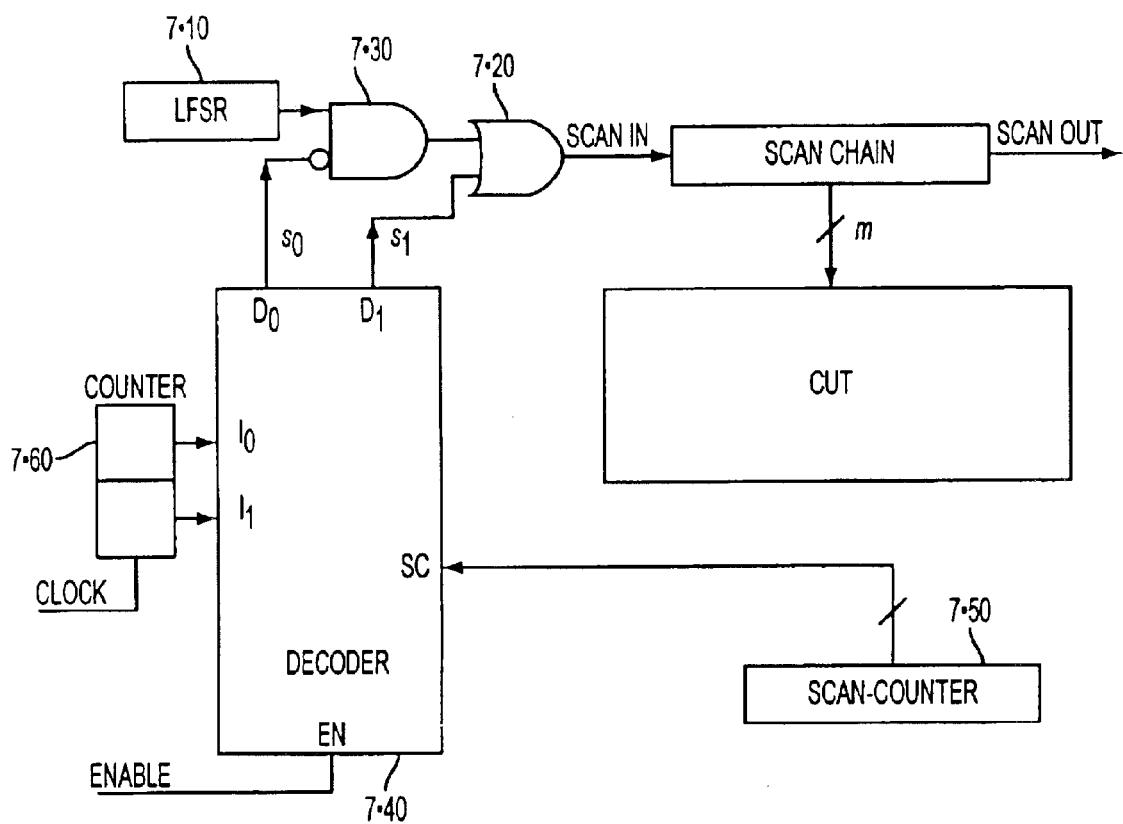
FIG. 7 shows a preferred embodiment of the disclosed serial type test-per-scan BIST circuit with 3-weight WRPT.

A preferred embodiment of the disclosed second type of test-per-scan BIST, which is called the serial type test-per-scan BIST, is shown in FIG. 7. An OR 7.20 and AND 7.30 gate each of which is driven by two output signals of DECODER 7.40, D0 and D1, respectively, alters the random pattern sequence generated by an LFSR 7.10. COUNTER 7.50 and SCAN-COUNTER 7.60 determine the states of two output signals of DECODER. SCAN-COUNTER is an (n+1)-modulo counter where in is the number of scan elements in the scan chain 7.70. At least $[\log(n)]$ stages of counter is necessary for SCAN-COUNTER. Note that SCAN-COUNTER is required by all test-per-scan BIST techniques and not particular to implement the disclosed 3-weighted WRPT BIST.

Like the parallel type test-per-scan BIST and test-per-clock BIST, the area overhead of the decoder of the serial type test-per-scan BIST is determined by the number of generators (the number of stages of COUNTER) and the number of overriding signals specified in the global generator, glob_gen. Typically, circuits that have may scan elements will require many overriding signals if they are equally random pattern resistant. Hence, such circuits many require high area overhead to implement DECODER. In the test-per-clock BIST and parallel type test-per-scan BIST, all inputs that are assigned binary values in the generator that is currently being applied are fixed to the corresponding binary values in parallel at the same cycle and hence all compatible overriding signals can be merged into one overriding signal.

However, the serial type test-per-scan BIST has only two overriding signals and values for scan inputs that are assigned binary values in the generator that is currently being applied are altered serially (at different cycles) by the two overriding signals. Hence, the technique to merge compatible overriding signals to reduce area overhead of DECODER, which is described in IV.B, is not applicable to the serial type of test-per-scan BIST. In the serial type test-per-scan BIST, area overhead of DECODER can be reduced by inserting toggle flip-flops 9.10 and 9.20 between outputs of DECODER and the AND and OR gates as shown in FIG. 9.

Consider implementing a serial type test-per-scan BIST for two generators, gen($C^0$) and gen($C^1$), shown in FIG. 8. First, consider an implementation shown in FIG. 7 where the outputs of DECODER are connected to the AND and OR gates directly so that one output of DECODER, $D_0$, is connected to an input of the AND and the other output of DECODER, $D_1$, is connected to an input of the OR gate. Assume that the initial value of SCAN-COUNTER is 0 and the value for scan input $p_o$ is scanned in first and that for scan input $p_7$ is scanned in last. At the positive (or negative) edge of each scan shift cycle, SCAN-COUNTER increases by 1 and a new value for a scan input is scanned into the scan chain. This is repeated until the new values for all 8 scan inputs are scanned in. If currently COUNTER=i and SCAN-COUNTER=j, then the value for $p_j$, which is determined by $g_j^i$, is scanned in; if $g_j^i=1$, then a 1 is scanned in, and if $g_j^i=0$, then 0 is scanned in, and if $g_j^i=U$ or X, then a random binary value is scanned in.

In FIG. 8, $g_3^0$, $g_5^0$, and $g_6^0$ are assigned 1's in gen($C^0$) and $g_4^1$, $g_5^1$, and $g_7^1$ are assigned 1's in gen($C^1$). Hence, $s_1$ is set to a 1 when COUNTER=0 and SCAN-COUNTER=3, 5, and 6 and when COUNTER=1 and SCAN-COUNTER=4, 5, and 7. The on-set of the function for $s_1$ has 6 minterms. Similarly, $s_0$ is set to 1 when COUNTER=0 and SCAN-COUNTER=1, 2 and 4 and COUNTER=1 and SCAN-COUNTER=0, 2, 3. The on-set of the function for $s_0$ has also 6 minterms (see FIG. 8 (b)).

Figure 9:
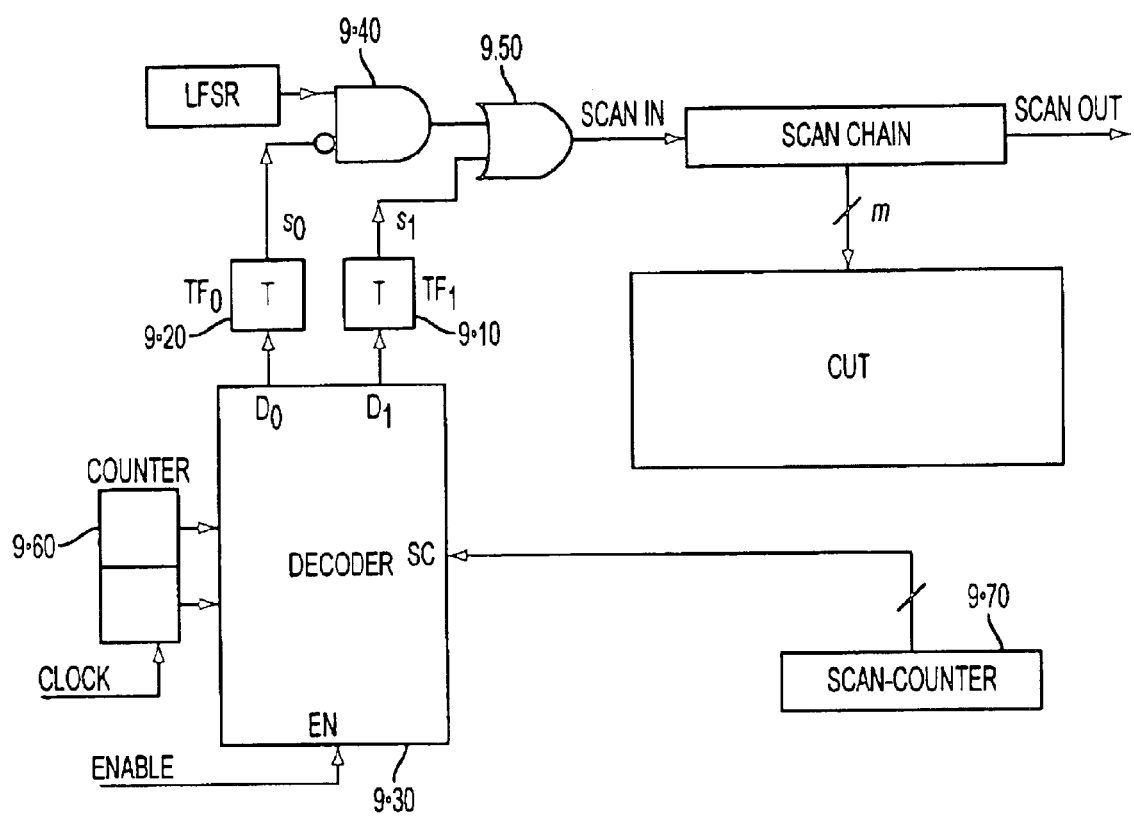
FIG. 9 shows a serial type test-per-scan BIST circuit with toggle flip-flops.

FIG. 9 shows a different implementation for the serial type test-per-scan BIST described in the previous paragraph. Note that toggle flip-flop $TF_1$ 9.10 is inserted between an output $D_1$ of DECODER 9.30 and an input of the OR gate 9.40 and toggle flip-flop $TF_0$ 9.20 is inserted between the other output of DECODER $D_0$ and an input of the AND 9.50 gate. Assume that toggle flip-flop $TF_0$ is initialized to a 1 and toggle flip-flop $TF_1$ is initialized to a 0 before each scan shift operation starts. The COUNTER and SCAN_COUNTER are 9.60 and 9.70, respectively. First, consider applying gen($C^0$). The state of $TF_1$, which stays at a 0 until COUNTER=0 and SCAN-COUNTER=2, toggles to a 1 when the value for $p_3$ is scanned i.e., COUNTER=0 and SCAN-COUNTER=3. $p_3$ is the first scan input in the scan chain that is assigned a 1 in gen($C^0$). The state of $TF_1$ should toggle to a 0 at the next cycle, SCAN-COUNTER=4, since $g_4^0=0$. The state of $TF_1$ should toggle one more time at COUNTER=0 and SCAN-COUNTER=5 and stay at a 1 until the end of scan shift cycles. While COUNTER=1 i.e., gen($C^1$) is being applied, the state of $TF_1$ needs to toggle only once when SCAN-COUNTER=4 since $p_4$ is the first scan input in the scan chain that is assigned a 1 in gen($C^1$) and all scan inputs following $p_4$ in the scan chain are assigned only X or 1 in gen($C^1$). As a conclusion, the on-set of the function for $s_1$ has only 4 minterms; COUNTER=0 and SCAN-COUNTER=3, COUNTER=0 and SCAN-COUNTER=4. COUNTER=0 and SCAN-COUNTER=5, and COUNTER=1 and SCAN-COUNTER=4. Similarly, the on-set of the function for $s_0$ has also 4 minterms (see FIG. 8 (c)). Note that if $g_j^i=1$, i.e., $TF_1=1$, the state of $TF_0$ is don't care since the output of the OR gate can be assigned a 1 by $TF_1=1$ independent of the state of $TF_0$. Hence, the state of $TF_0$ at COUNTER=0 and SCAN-COUNT=5 need to be changed. In this example, though the number of minterms is reduced only by 4 by inserting the toggle flip-flops, in practical circuits that have long scan chains, inserting toggle flip-flops can drastically reduce the number of minterms.

In order to obtain DECODER that requires minimum area overhead, scan chains should be reordered such that the toggle flip-flops change their states the minimum number of times during scan shift operations for each generator. In this disclosure, the problem of reordering a scan chain is achieved by using genetic algorithms. For further background information on Genetic Algorithms, See_D. E. Goldberg. *Genetic Algorithms in Search, Optimization, and Machine Learning*. Addison Wesley, Reading, M.A, 1989.

Genetic algorithms have been widely used to solve NP-complete problems in reasonable computation time since introduced by Holland. See J. H. Holland, *Adaptation in Natural and Artificial Systems*, University of Michigan Press, Ann Arbor, Mich., 1975. Genetic algorithms start with an initial population that are randomly generated. A genetic code is assigned to each individual and a fitness function that is calculated from the genetic code is given to each individual. Individuals in each generation survive or vanish through a genetic evolutionary process. Individuals that have better fitness functions are given higher chance to survive and to be forwarded to the next generation. The surviving individuals often produce their offspring individuals that have partly different genetic codes from their genetic codes by exchanging their genetic codes with other individuals (crossover process) and flipping a part of their genetic codes (mutation process).

In the genetic algorithm used in this disclosure, a permutation of scan elements in the scan chain is encoded as the genetic code of each individual. The objective of the genetic algorithm used is to find a order of scan elements that leads to the function of the decoder that has the minimum number of minterms. A nonnegative fitness function, which denotes the number of toggles required at the two toggle flip-flops to alter random test sequences according to values assigned in each generator, is calculated for each individual in the current generation:

$$\text{Cost} = \sum_{i=1}^{d} \sum_{j=1}^{n} (Toggle_0(i, j) + Toggle_1(i, j)), \quad (13)$$

where d is the number of generator and n is the number of scan inputs and $Toggle_0(i, j)$ and $Toggle_1(i,j)$ are given as follows:

$$Toggle_0(i, j) = \begin{cases} 1 & \text{if } (TF_0(i, j-1) = 0 \text{ and } g_j^i = 0) \\ & \text{or } (TF_0(i, j-1) = 1 \text{ and } g_j^i = U) \\ 0 & \text{otherwise} \end{cases} \quad (14)$$

$$Toggle_1(i, j) = \begin{cases} 1 & \text{if } (TF_1(i, j-1) = 1 \text{ and } g_j^i = 0 \text{ or } g_j^i = U) \\ & \text{or } (TF_1(i, j-1) = 0 \text{ and } g_j^i = 1) \\ 0 & \text{otherwise,} \end{cases}$$

where $TF_0(i, j-1)$ and $TF_1(i, j-1)$ are the states of the toggle flip-flops at the previous scan shift cycle. Initially (j=1), $TF_0(i, j)=1$ and $TF_1(i, j)=0$ and thereafter $TF_0(i, j)$ ($TF_1(i, j)$) toggles its state whenever $Toggle_0(i,j)=1$ ($Toggle_1(i,j)=1$).

As compatible overriding signals can be merged in the test-per-clock BIST and the parallel type test-per-scan BIST, in the serial type test-per-scan BIST, compatible scan inputs can be merged before scan chains are ordered by the genetic algorithm. Any two scan inputs, $p_i$ and $p_j$, are compatible if the value of $g_i^a$ is the same as that of $g_j^a$ or either $g_i^a$ or $g_j^a$ is assigned X in every generator; otherwise $p_i$ and $p_j$ are not compatible. If compatible scan inputs are merged into a group of scan inputs and groups of compatible scan inputs are ordered instead of individual scan inputs, the run time of the genetic algorithm can be reduced to obtain the order that leads to the minimum number of minterms by reducing the number of inputs to the genetic algorithm.

Due to routing or load capacitance constraint (or timing constraint) of scan elements, some scan elements should be placed in neighbor not to violate routing and/or load capacitance constraint. This limitation in reordering scan chains can be relaxed by exploiting the compatibility of scan inputs. The toggle flip-flops of the serial type test-per-scan BIST do not toggle their states while values for the compatible scan inputs are scanned in. Hence, scan inputs in a group of compatible scan inputs can be rearranged to satisfy routing or load capacitance constraint of scan elements without increasing the number of minterms of the function to implement the decoder that generates overriding signals. Typically, significant number of scan inputs are assigned X in every generator. These scan inputs can be placed in any position of the scan chain since they are compatible with any other scan input in the scan chain. If such scan inputs are placed in proper positions, routing or load capacitance constraint of scan elements can be satisfied without increasing the number of minterms to implement the decoder.

Typically, the serial type test-per-scan BIST requires more hardware overhead to implement the decoder than the parallel type test-per-scan BIST. However, since the serial type test-per-scan BIST does not require scan elements that have R and/or S pins or extra two input OR or AND gates that are required to fix scan inputs in the parallel type test-per-scan BIST, overall hardware overhead to implement the serial type test-per-scan BIST is comparable to that to implement the parallel type test-per-scan BIST. Furthermore, compared to the parallel type test-per-scan BIST, which requires routing overhead to connect overriding signals from the output pins of the decoder to corresponding S and/or R pins of scan elements that need to be fixed, the serial type test-per-scan BIST, which has only two overriding signals, requires very little routing overhead. Hence, if the design in which the BIST is to be inserted has routing congestion, the serial type test-per-scan BIST will be a better choice.

IV.E. Experimental Results

Results of simulation experiments using the disclosed BIST are reported in Table 2. The experiments were conducted with logic synthesis and ISCAS benchmark circuits. Most of logic synthesis benchmark circuits have many more hard-to-detect faults than ISCAS benchmark circuits. Also to demonstrate the scalability of the disclosed improved ATPG, the experimental results for large ISCAS benchmark circuits are reported. The experiments were performed on a 300 MHz Sun Ultra 2 with 1 Gbytes of memory.

In the experiments for the test-per-clock BIST, it is assumed that the outputs of all flip-flops of circuits to be primary inputs and the inputs of all flip-flops to be primary outputs. Also, in the experiments for test-per-scan BIST, it is assumed that all primary inputs are driven by the same scan chain that contains all flip-flops in the circuit all of which are transformed to scan elements.

The column labeled # PI shows the number of primary inputs and # lines the number of circuit lines of each circuit. The column labeled # HF reports the number of faults that remain undetected after a set of pseudo-random patterns are applied. The numbers in parentheses in the same column are the numbers of the pseudo-random patterns that are applied to detect easy-to-detect faults (for short, easy faults). The column labeled EFC reports fault coverages that are obtained by applying pseudo-random patterns. In order to demonstrate the feasibility of applying the disclosed technique to circuits with significant number of hard-to-detect faults, very short random pattern sequences are applied. The column labeled # RPL reports the number of pure pseudo-random patterns that are generated by m-stage LFSRs, where m is the number of inputs, to achieve 100% or close to 100% fault coverage. The column labeled Tlen shows the total number of test patterns that are generated by the disclosed BISTs to achieve 100% fault coverage and the numbers in the parentheses in the same column are the reduction factor in test sequence length due to the disclosed BIST techniques. m-stage LFSRs (where m is the number of inputs) are used to apply random patterns to conflicting inputs. The column labeled M shows the maximum conflicting inputs of each testcube set. The column labeled T shows the periods during which each generator is applied to circuits. The column labeled # G shows the number of generators generated by the disclosed improved ATPG. The column labeled # before OS shows the number of overriding signals before compatible overriding signals are merged and # after OS shows the number of overriding signals after compatible overriding signals are merged. Run times reported in the column labeled Run Time include fault simulation time for entire test sequence (pseudo-random pattern sequence applied to detect easy faults and 3-weight WRPT sequence) generated by the disclosed BIST as well as the disclosed improved ATPG run time. Backtrack limits of 500 are used for all circuits.

TABLE 2

Experimental Results

| Circuits Information | | | | | | | | | | before | after | Run | DECODER | |
|---|---|---|---|---|---|---|---|---|---|---|---|---|---|---|
| Name | # PI | # lines | # HF | EFC | RPL | TLen | M | T | # G | # OS | # OS | Time | TPC | TPS |
| b3 | 32 | 1165 | 192 (4K) | 82.48 | 58.8K | 5.8K (10) | 8 | 128 | 13 | 36 | 24 | 1.7s | 74.5 | 159.0 (190.5) |
| bc0 | 21 | 1252 | 99 (4K) | 91.73 | 152K | 5.2K (29) | 8 | 128 | 9 | 29 | 18 | 0.8s | 47.5 | 134.0 (118.5) |
| chkn | 29 | 868 | 151 (128K) | 82.07 | 2.86M | 132K (22) | 8 | 128 | 11 | 33 | 14 | 3.4s | 42.0 | 88.0 (124.0) |
| in3 | 34 | 633 | 55 (4K) | 90.82 | 955K | 4.6K (208) | 8 | 128 | 4 | 27 | 6 | 0.2s | 6.5 | 56.0 (80.5) |
| in4 | 32 | 1178 | 91 (32K) | 91.69 | 1.31M | 34.0K (39) | 8 | 128 | 10 | 28 | 14 | 1.7s | 37.5 | 115.5 (112.0) |
| in6 | 33 | 483 | 44 (4K) | 90.74 | 85.4K | 4.6K (19) | 8 | 128 | 4 | 22 | 7 | 0.1s | 6.5 | 69.0 (68.5) |
| rck1 | 32 | 351 | 124 (512K) | 65.27 | >50M | 525K (>95) | 8 | 128 | 4 | 33 | 6 | 7.8s | 6.0 | 40.5 (36.0) |
| ti | 43 | 1555 | 120 (2K) | 91.67 | 66.4K | 2.7K (25) | 8 | 128 | 5 | 25 | 6 | 0.8s | 12.0 | 58.5 (80.0) |
| vg2 | 25 | 510 | 33 (2K) | 92.99 | 872K | 2.7K (323) | 8 | 128 | 5 | 44 | 6 | 0.1s | 16.0 | 61.5 (90.5) |
| vtx1 | 27 | 553 | 47 (16K) | 91.06 | 3.93M | 16.9K (233) | 8 | 128 | 4 | 38 | 3 | 0.4s | 3.0 | 27.5 (39.0) |
| x7dn | 66 | 2174 | 132 (16K) | 93.67 | 433K | 17.9K (24) | 8 | 128 | 12 | 42 | 16 | 3.0s | 58.0 | 135.0 (168.5) |
| x9dn | 27 | 569 | 44 (16K) | 91.74 | 4.71M | 65.9K (71) | 8 | 128 | 3 | 38 | 3 | 0.9s | 4.0 | 27.0 (46.5) |
| xparc | 39 | 2297 | 408 (1M) | 80.94 | 335M | 1.0M (335) | 8 | 128 | 14 | 45 | 23 | 1m55s | 76.0 | 233.5 (203.0) |
| c880 | 60 | 880 | 38 (4K) | 95.00 | 15K* | 4.9K (3.0) | 10 | 256 | 3 | 41 | 4 | 0.4s | 6.0 | 43.0 (106.0) |
| c1355 | 41 | 1355 | 53 (1K) | 95.71 | 4K* | 2.0K (2.0) | 10 | 256 | 4 | 47 | 8 | 1.8s | 6.0 | 71.0 (84.5) |
| c1908 | 33 | 1908 | 88 (2K) | 94.39 | 10K* | 3.6K (2.8) | 10 | 512 | 3 | 33 | 4 | 4.3s | 2.0 | 47.5 (59.0) |
| c2670 | 157 | 2594 | 368 (4K) | 83.03 | 4.6M* | 8K (575) | 10 | 512 | 8 | 74 | 19 | 26.9s | 39.0 | 175.0 (258.5) |

TABLE 2-continued

Experimental Results

| Circuits Information | | | | | | | | | | before | after | Run | DECODER | |
|---|---|---|---|---|---|---|---|---|---|---|---|---|---|---|
| Name | # P1 | # lines | # HF | EFC | RPL | TLen | M | T | # G | # OS | # OS | Time | TPC | TPS |
| c3540 | 50 | 3540 | 139 (1K) | 95.17 | >10M | 2.6K (>3846) | 10 | 256 | 6 | 52 | 14 | 1m34s | 24.0 | 127.0 (159.0) |
| c5315 | 178 | 5315 | 303 (4K) | 93.31 | >50M | 6.1K (>8197) | 12 | 512 | 4 | 101 | 8 | 9.0s | 7.0 | 94.5 (200.0) |
| c7552 | 206 | 7551 | 281 (2K) | 94.86 | >100M* | 6.7K (>14925) | 12 | 512 | 9 | 181 | 24 | 41.5s | 66.0 | 225.0 (409.0) |
| s420 | 35 | 420 | 32 (1K) | 90.59 | 1.1M* | 1.4K (786) | 8 | 128 | 3 | 32 | 4 | 0.0s | 8.0 | 42.0 (81.0) |
| s641 | 54 | 637 | 34 (512) | 91.37 | 1.0M* | 768 (1302) | 8 | 128 | 2 | 27 | 2 | 0.5s | 0.5 | 33.0 (51.5) |
| s838 | 67 | 838 | 56 (512) | 91.75 | >100M* | 3.1K (>32$x^6$) | 10 | 512 | 6 | 59 | 5 | 0.3s | 13.0 | 68.5 (139.5) |
| s5378 | 214 | 5378 | 240 (4K) | 94.05 | >10M | 9.2K (>1086) | 12 | 1024 | 5 | 80 | 6 | 6.4s | 16.0 | 86.5 (202.5) |
| s9234 | 247 | 9234 | 876 (32K) | 84.77 | 11M* | 44.0K (250) | 12 | 1024 | 11 | 208 | 31 | 2m56s | 91.0 | 146.5 (611.0) |
| s13207 | 700 | 13969 | 1479 (64K) | 81.63 | 264K | 71.6K (3.7) | 12 | 1024 | 6 | 174 | 8 | 5m05s | 16.5 | 120.0 (380.5) |
| s15850 | 611 | 16531 | 1363 (64K) | 85.58 | >100M* | 87.0K (1149) | 12 | 1024 | 21 | 259 | 21 | 5m47s | 82.0 | 264.5 (631.5) |
| s35932 | 1763 | 37660 | 3731 (8K) | 86.98 | >10M | 10.2K (>980) | 16 | 2048 | 1 | 560 | 1 | 24m42s | 0.5 | 6.5 (251.5) |
| s38417 | 1664 | 40081 | 3428 (32K) | 86.95 | >100M* | 86.0K (>1163) | 16 | 2048 | 26 | 696 | 49 | 34m59s | 169.5 | 626.0 (1865.5) |
| s38584 | 1464 | 40162 | 4731 (2K) | 84.12 | >100M* | 49.1K (>2040) | 16 | 2048 | 8 | 197 | 14 | 29m16s | 30.5 | 197.0 (584.5) |

*The random pattern sequence lengths for these circuits are as reported in [AK96].

The heading DECODER reports hardware overhead due to implementing the decoders, which generate overriding signals, as gate equivalents. The column labeled TPCreports hardware overhead for test-per-clock BIST implementations and TPS for serial type test-per-scan BIST implementations. In order to demonstrate that inserting two toggle flip-flops and reordering scan chains (See Section 6.2) can reduce hardware overhead to implement the decoders, gate equivalents for both implementations are reported: implementation with toggle flip-flops and re-ordered scan chains (numbers at the left-hand side of the column) and implementation without toggle flip-flops (numbers in the parentheses in the column). The decoder circuits are obtained by running SIS for two level circuit implementations. Only NAND and NOR gates and inverters are used to synthesize the decoders. The gate equivalents are computed in the manner suggested in J. Hartmann: 0.5 n for an in-input NAND or NOR gate and 0.5 for an inverter. See J. Hartmann and G. Kemnitz, How to Do Weighted Random Testing for BIST, in *Proceedings IEEE International Conference on Computer-Aided Design*, pages 568–571, 1993.

100% fault coverage is attained for all benchmark circuits. The test length required to achieve 100% fault coverage is dramatically reduced by the disclosed BIST technique. It is reported in M. F. AlShaibi that s838 requires more than 100 Meg test patterns to achieve 100% fault coverage. See M. F. AlShaibi and C. R. Kime, MFBIST: A BIST Method for Random Pattern Resistant Circuits, In *Proceedings IEEE International Test Conference*, pages 176–185, 1996. However, test patterns generated by the disclosed BIST achieve the same fault coverage with only 512+6×512=3, 072 test patterns, where 512 is the number of pure random patterns applied to detect easy faults. This implies that test length required to detect all faults is reduced by factor of about 32×$10^6$. Clearly greater reductions are achieved for the random pattern resistant circuits that require long pure random test sequence, such as xparc, s838, c5315, and c7552 where test sequence lengths are reduced by several orders of magnitude. It should be noticed that only 26 generators are required for s38417 that requires the largest number of generators even though unrealistically large number of hard-to-detect faults, 3428 faults, are used. This is due to the fact that many of tests for hard-to-detect faults share common input assignments for their detection. Since the test sequence length required for the disclosed BIST is determined by the number of generators, this demonstrates that the test sequence length will not grow even in circuits that have large number of hard-to-detect faults. In fact, even though significant number of hard-to-detect faults are used for all circuits, test sequence lengths of 3-weight WRPT are even shorter than those of pseudo-random test sequences, which are applied to detect, easy faults in most circuits. This indicates that test sequences with reasonable lengths can be obtained for large M so that hardware overhead to implement the disclosed BISTs will be low in large practical designs.

To estimate the hardware overhead that should be added to pseudo-random BIST circuitry such as LFSR's to implement the disclosed BIST techniques, the gate equivalents of the decoders that generate overriding signals are listed. The number of the AND and/or OR gates, which should be also added to pseudo-random BIST circuitry to override random signals in test-per-clock BISTs (see FIG. 3), is the same as the number of overriding signals before the compatible inputs are merged i.e. the numbers listed in the column labeled before #OS. The number of flip-flops to implement the counter that selects each generator can simply be computed by [$\log_2$(the number of generators)] and hence grows very slowly as the number of generators grows. Only 5-bit counter is enough for s38417 that requires 26 generators. Very little hardware is required to implement the decoders for test-per-clock BISTs and parallel type test-per-scan BISTs. Even for large circuits such as s38417 with 3428 hard faults, the gate equivalent is only 169.5. Although serial type test-per-scan BISTs require more hardware over-head to implement the decoders than test-per-clock BISTs, hardware overhead to implement the decoders will not have significant area impact. For example, the gate equivalent required to implement the decoder of a serial type test-per-scan BIST for s38417 whose combinational portion has about 24,500 gate equivalents are only 626, in other words, only 2.6% of the gate equivalents of the combinational portion of s38417. This clearly demonstrate that the disclosed BIST is applicable to large circuits with large numbers of hard-to-detect faults at affordable cost.

The experimental results show that hardware overhead to implement serial type test-per-scan BISTs can be significantly reduced by inserting toggle flip-flops and reordering scan chains. Except a few circuits such as xparc, bc0, and rckl (even for such circuits, increase in gate equivalents is negligible), significant reduction in gate equivalents is obtained for most circuits. Especially, large reduction is obtained for large circuits such as s9234 (76% reduction), s13207 (68.5% reduction), s38417 (66.4% reduction), and s38584 (66.3% reduction).

The run time reported in the table clearly demonstrates the feasibility of the disclosed improved ATPG. Experiments show that even more run times are spent by fault simulation that is performed to measure fault coverage obtained by the disclosed BIST sequences rather than the disclosed improved ATPG run times in most circuits.

Table 3 compares the results of the disclosed test-per-clock BIST with those of other test-per-clock BIST methods, which use similar random pattern testing techniques, on the test sequence length (heading Tlen) and hardware overhead added to pure pseudo-random BIST. For more background information on these other methods, See I. Pomeranz and S. Reddy, 3-Weight Pseudo-Random Test Generation Based on a Deterministic Test Set for Combinational and Sequential Circuits, *IEEE Trans. On Computer-Aided Design of Integrated Circuit and System*, Vol. 12:1050–1058, July 1993; M. Bershteyn, Calculation of Multiple Sets of Weights for Weighted Random Testing, in *Proceedings IEEE International Test Conference*, pages 1031–1040, 1993; M. F. AlShaibi and C. R. Kime, Fixed-Biased Pseudorandom Built-In Self-Test For Random Pattern Resistant Circuits, in *Proceedings IEEE International Test Conference*, pages 929–938, 1994; and N. Touba and E. McCluskey, Synthesis of Mapping Logic for Generating Trans-formed Pseudo-Random Patterns for BIST, in *Proceedings IEEE International Test Conference*, pages 674–682, 1995.

Hardware overheads are estimated on the number of flip-flops FF and gates GE, separately. GE's for Bershetyn, Pomeranz et al, and Touba'95 are computed as described in Touba'95. M. Bershteyn, Calculation of Multiple Sets of Weights for Weighted Random Testing, In *Proceedings IEEE International Test Conference*, pages 1031–1040, 1993; I. Pomeranz and S. Reddy, 3-Weight Pseudo-Random Test Generation Based on a Deterministic Test Set for Combinational and Sequential Circuits, *IEEE Trans On Computer-Aided Design of Integrated Circuit and System*, Vol. 12:1050–1058, July 1993; N. Touba and E. McCluskey, Synthesis of Mapping Logic for Generating Trans-formed Pseudo-Random Patterns for BIST, In *Proceedings IEEE International Test Conference*, pages 674–682, 1995.

TABLE 3

Comparisons (Test-Per-Clock BIST)

| CKT Name | [Ber93] TLen | FF | GE | [PR93] TLen | FF | GE | [AK96] TLen | F | GE | [TM95] TLen | M | GE | Proposed TLen | FF | GE |
|---|---|---|---|---|---|---|---|---|---|---|---|---|---|---|---|
| c880 | 1515 | 1 | 330 | 3K | 2 | 54 | 1140 | 0 | 0 | 1024 | | 27 (150) | 4.9K | 2 | 47 |
| | | | | 12K | 2 | 41.6 | | | | | | | | | |
| c1355 | 1527 | 1 | 225.5 | 3K | 2 | 5.0 | 2460 | 0 | 0 | 3072 | | 11 (72) | 2.0K | 2 | 53 |
| | | | | 8K | 1 | 2.0 | | | | | | | | | |
| c1908 | | | | 4K | 2 | 0 | 2937 | 6 | 14 | 4096 | | 12 (61) | 3.6K | 2 | 35 |
| | | | | | | | 10K | 0 | 0 | | | | | | |
| c2670 | 1.3K | ≤4 | 4078 | 19K | 5 | 1507 | 5592 | 55 | 385 | 1K | 12 | 218 (567) | 8K | 3 | 113 |
| | 12K | ≤2 | 1981 | 30K | 5 | 1316 | 8854 | 29 | 203 | 5120 | 4 | 121 (470) | | | |
| c7552 | 2K | ≤4 | 4554 | 47K | 6 | 3003 | 22K | 105 | 735 | 10K | 6 | 186 (496) | 6.7K | 4 | 247 |
| | 69K | ≤3 | 2380 | 72K | 6 | 2475 | 16K | 127 | 889 | 50K | 6 | 139 (449) | 10K | 3 | 195 |
| s420 | 532 | ≤2 | 350 | | | | 1632 | 1 | 7 | 500 | 4 | 37 (88) | 1.4K | 2 | 40 |
| | 1.8K | ≤1 | 245 | | | | 2040 | 1 | 7 | 1K | 4 | 28 (79) | | | |
| s641 | 593 | ≤2 | 459 | | | | 648 | 17 | 119 | 500 | 3 | 22 (103) | 768 | 1 | 27.5 |
| | | | | | | | 4320 | 0 | 0 | 1K | 1 | 12 (93) | | | |
| s838 | 893 | ≤3 | 770 | | | | 3696 | 28 | 196 | 850 | 7 | 86 (185) | 3.1K | 3 | 72 |
| | 17K | ≤1 | 469 | | | | 4554 | 1 | 7 | 10K | 1 | 37 (137) | | | |
| s9234 | 893 | ≤3 | 770 | | | | 30K | 73 | 511 | | | | 44K | 4 | 299 |
| | 17K | ≤1 | 469 | | | | 151K | 32 | 224 | | | | 133K | 1 | 87 |
| s13207 | | | | | | | 44K | 15 | 105 | | | | 72K | 3 | 190.5 |
| | | | | | | | 119K | 7 | 49 | | | | 134K | 2 | 139 |
| s15850 | | | | | | | 118K | 9 | 63 | | | | 87K | 5 | 341 |
| | | | | | | | 37K | 53 | 371 | | | | 57K | 5 | 405 |
| s38417 | | | | | | | 69K | 342 | 2394 | | | | 86K | 5 | 865.5 |
| | | | | | | | | | | | | | 65K | 5 | 1065 |
| s38584 | | | | | | | 78K | 18 | 126 | | | | 49.1K | 3 | 227.5 |

M. Bershteyn uses conventional weighted random pattern BIST with various weights. See M. Bershteyn. Calculation of Multiple Sets of Weights for Weighted Random Testing. In *Proceedings IEEE International Test Conference*, pages 1031–1040, 1993. The column WS shows the number of weighted sets. The number of flip-flops, FF, and gates, GE, are computed as follows:

FF=$\log_2$(number of weight sets)
GE=(4+(1.5)WS)(number of inputs in CUT).

Pomeranz uses the similar technique to the disclosed BIST. See I. Pomeranz and S. Reddy. 3-Weight Pseudo-Random Test Generation Based on a Deterministic Test Set for Combinational and Sequential Circuits. *IEEE Trans. On Computer-Aided Design of Integrated Circuit and System*, Vol. 12:1050–1058, July 1993. A difference of Pomeranz from the disclosed BIST is in the way testcubes are generated. See I. Pomeranz and S. Reddy. 3-Weight Pseudo-Random Test Generation Based on a Deterministic Test Set for Combinational and Sequential Circuits. *IEEE Trans. On Computer-Aided Design of Integrated Circuit and System*, Vol. 12:1050–1058, July 1993.

In contrast to the disclosed technique, in Pomeranz, the testcubes for all hard-to-detect faults are prepared before the procedure to find inputs to be fixed is applied. See I. Pomeranz and S. Reddy, 3-Weight Pseudo-Random Test Generation Based on a Deterministic Test Set for Combinational and Sequential Circuits, *IEEE Trans. On Computer-Aided Design of Integrated Circuit and System*, Vol. 12:1050–1058, July 1993. 3-gate modules are used to fix a subset of inputs to deterministic vectors that are called expanded tests. The hardware overhead is computed as follows:

FF=$\log_2$(number of expanded tests)

GE=(number of 3-gate modules) (1+average fan-in).

In Touba'95, random vectors that do not detect any new faults are mapped to the deterministic vectors for hard-to-detect faults by a mapping logic that is placed between the TPG and the inputs of a CUT. See N. Touba and E. McCluskey, Synthesis of Mapping Logic for Generating Trans-formed Pseudo-Random Patterns for BIST, in *Proceedings IEEE International Test Conference*, pages 674–682, 1995. The column GE shows the gate equivalents for the mapping logics. The estimation of the gate equivalents is based on J. Hartmann: 0.5nGE's for an n-input NAND or NOR, 2.5(n-1)GE's for an in-input XOR, and 1.5GE's for a 2-to-1 MUX. See J. Hartmann and G. Kemnitz, How to Do Weighted Random Testing for BIST, in *Proceedings IEEE International Conference on Computer-Aided Design*, pages 568–571, 1993. Since the mapping logic can degrade circuit performance seriously, the authors recommend to use MUX's to bypass the mapping logic during normal operation. The numbers in parentheses in the column GE include gate equivalents for such MUX's. See M. F. AlShaibi and C. R. Kime, MFBIST: A BIST Method for Random Pattern Resistant Circuits, *In Proceedings IEEE International Test Conference*, pages 176–185, 1996.

M. F. AlShaibi'96 is an improved version of M. F. AlShaibi'94 where multiple idler registers are used to apply random patterns or fixed values to the inputs of a circuit. See M. F. AlShaibi and C. R. Kime, MFBIST: A BIST Method for Random Pattern Resistant Circuits, in *Proceedings IEEE International Test Conference*, pages 176–185, 1996; and M. F. AlShaibi and C. R. Kime, Fixed-Biased Pseudorandom Built-In Self-Test For Random Pattern Resistant Circuits, in *Proceedings IEEE International Test Conference*, pages 929–938, 1994.

A SFN cell is assigned to each input to be fixed. Each SFN cell, which is composed of two flip-flops, can function in four different modes by reconfigurating the connections of two flip-flops. For each configuration sequence, a new set of fixed values, which are stored in a memory device, are loaded into the corresponding SNF cells. The hardware overhead reported is the gate equivalents for only SFN cells (the number of fixed inputs):

$$GE=(SFN_{cost} \times F=7 \times F).$$

Unlike all other methods where hardware overheads for the BIST controllers, which may be complex circuits, are not counted, the GE's for the disclosed BIST include not only the gates to fix inputs but also the gates to implement the BIST controllers. Nonetheless, GE's for the disclosed BIST are the smallest for most circuits. A key reason, it is believed, is the introduction of the disclosed improved ATPG. Compared to M. F. AlShaibi, which requires many flip-flops, the disclosed BISTs require very few flip-flops (only 5 flip-flops for the largest circuit). Also compared to M. F. AlShaibi that may require complex control scheme, the disclosed BIST has a very simple architecture. See M. F. AlShaibi and C. R. Kime, MFBIST: A BIST Method for Random Pattern Resistant Circuits, In *Proceedings IEEE International Test Conference*, pages 176–185, 1996.

The test sequence lengths for some circuits of are shorter than those of the disclosed BIST. See N. Touba and E. McCluskey, Synthesis of Mapping Logic for Generating Trans-formed Pseudo-Random Patterns for BIST, In *Proceedings IEEE International Test Conference*, pages 674–682, 1995; and M. F. AlShaibi and C. R. Kime, MFBIST: A BIST Method for Random Pattern Resistant Circuits, In *Proceedings IEEE International Test Conference*, pages 176–185, 1996. However, in the disclosed technique, periods, $T_i$, during which generator gen ($C^i$) is applied are the same for every generator gen($C^i$), where i=1,2, . . . . Hence, even though all faults that are targeted by generator gen($C^i$) are detected before all $T_i$ test patterns are applied, the disclosed BIST continues to generate test patterns for generator gen($C^i$) until all $T_i$ test patterns are generated. This increases test sequence length since many test patterns are wasted without detecting any new faults. If variable periods are used so that each generator is applied until all faults that are targeted by each generator are detected, then test sequence length can be reduced. However, this will make BIST controllers more complex. This is one of reasons that GE's for the disclosed BIST are the smallest for most circuits even though we include hardware overhead to implement BIST controllers. Another advantage of using the same one period for all generators is that it makes the implemented BISTs less dependent on random pattern sequences that are applied to inputs that are not fixed. This will allow feedback polynomials or seeds of LFSRs that are used to generate random pattern sequences for the disclosed BISTs to be changed even after BIST controllers are already implemented. Note that the periods that each generator is applied are powers of 2 (the periods that random pattern sequences to detect easy faults also powers of 2). This also increases test sequence lengths for the disclosed BISTs. However, this reduces hardware overhead.

Table 4 compares the results of the disclosed test-per-scan BIST with those of other test-per-scan BIST methods. See N. A. Touba and E. J. McCluskey, Altering a Pseudo-Random Bit Sequence for Scan-Based BIST, In *Proceedings IEEE International Test Conference*, pages 167–175, 1996; H.-J. Wunderlich and G. Kiefer. Bit-Flipping BIST, In *Proceedings VLSI Testing Symposium*, pages 337–343, 1996; and M. Karkala, N A. Touba, and H.-J. Wunderlich. Special ATPG to Correlate Test Patterns for Low-Overhead Mixed-Mode BIST, In *In proceedings 7yrd Asian Test Symposium*, 1998. Results are compared on the test sequence length and hardware overhead. Hardware overhead for the disclosed BIST is based on the serial type test-per-scan BIST implementation.

TABLE 4

Comparisons (Test-Per-Scan BIST)

| | [TM96] | | | [KTW98] | | | [WK96] | | | Proposed | | |
|---|---|---|---|---|---|---|---|---|---|---|---|---|
| CKT Name | LFSR Size | Seq. ID Reg. Size | Lit. Count | LFSR Size | Seq. ID Reg. Size | Lit. Count | LFSR Size | Hard Fault | Prod. Term | Test Leng. | Lit. Count | COUNTER Size | Prod. Term |
| s420 | 14 | 3 | 70 | 14 | 1 | 36 | 32 | 58 | 5 | 1.4K | 67 | 3 | 12 |
|  | 10 | 4 | 70 | 10 | 3 | 59 |  |  |  | 8.3K | 7 | 1 | 1 |
| s641 | 14 | 4 | 87 | 14 | 2 | 80 | 32 | 8 | 6 | 768 | 45 | 2 | 8 |
|  | 9 | 6 | 109 | 9 | 5 | 98 |  |  |  | 8.3K | 7 | 1 | 1 |
| s713 |  |  |  |  |  |  | 32 | 8 | 6 | 2.6K | 20 | 1 | 4 |
| s838 | 14 | 7 | 176 | 14 | 5 | 164 | 32 | 340 | 109 | 3.1K | 108 | 3 | 17 |
|  | 12 | 7 | 199 | 12 | 6 | 183 |  |  |  |  |  |  |  |
| s953 |  |  |  |  |  |  | 32 | 8 | 3 | 4.6K | 14 | 1 | 2 |
| s1196 | 14 | 4 | 71 | 14 | 4 | 69 | 32 | 18 | 7 | 10.1K | 92 | 3 | 25 |
|  | 12 | 8 | 102 | 12 | 7 | 97 |  |  |  | 16.8K | 67 | 2 | 12 |
| s1238 |  |  |  |  |  |  | 32 | 17 | 8 | 7.7K | 105 | 3 | 28 |
|  |  |  |  |  |  |  |  |  |  | 16.9K | 33 | 1 | 7 |
| s5378 | 14 | 4 | 174 | 14 | 4 | 164 | 32 | 46 | 16 | 9.2K | 127 | 3 | 27 |
|  | 12 | 9 | 367 | 12 | 8 | 332 |  |  |  | 18.4K | 68 | 2 | 13 |
| c2670 | 16 | 5 | 334 | 16 | 4 | 313 | 32 | 209 | 163 | 8K | 269 | 3 | 81 |
|  | 10 | 12 | 427 | 10 | 8 | 385 |  |  |  |  |  |  |  |
| c7552 | 36 | 8 | 782 | 36 | 7 | 753 | 32 | 309 | 264 | 6.7K | 361 | 4 | 113 |
|  | 17 | 13 | 828 | 17 | 11 | 806 |  |  |  |  |  |  |  |

In Touba'96 and Karkala et al, the columns labeled LFSR Size show the number of stages of LFSR's that are used to generate pseudo-random sequences and the columns labeled Seq. ID Reg. Size show the size of the sequence ID. registers, which drive one of inputs of the bit-fixing sequence generation logics. See N. A. Touba and E. J. McCluskey, Altering a Pseudo-Random Bit Sequence for Scan-Based BIST, in *Proceedings IEEE International Test Conference*, pages 167–175, 1996; and M. Karkala, N A. Touba, and H.-J. Wunderlich, Special ATPG to Correlate Test Patterns for Low-Overhead Mixed-Mode BIST, *In proceedings 7γrd Asian Test Symposium*, 1998. The other input of the bit-fixing sequence generation logic is driven by Mod−(m+1) Counter, which corresponds to SCAN-COUNTER of the disclosed BIST (see FIG. 7). The bit-fixing sequence generation logic, which corresponds to the decoder of the disclosed BIST that generates overriding signals, generates control signals to covert useless pseudo-random sequences to deterministic testcubes. The columns Lit. Count show the literal count of the multilevel bit-fixing sequence generation logics. Results published in, Touba'96 and Karkala et al are obtained by applying 10,000 test patterns in all cases. See N. A. Touba and E. J. McCluskey, Altering a Pseudo-Random Bit Sequence for Scan-Based BIST, *In Proceedings IEEE International Test Conference*, pages 167–175, 1996; and M. Karkala, N A. Touba, and H.-J. Wunderlich. Special ATPG to Correlate Test Patterns for Low-Overhead Mixed-Mode BIST, *In proceedings 7γrd Asian Test Symposium*, 1998.

The column labeled Hard Fault of H.-J. Wunderlich shows the number of non-redundant faults that remain undetected after applying 10,000 pseudo-random patterns. See H.-J. Wunderlich and G. Kiefer. Bit-Flipping BIST. *In Proceedings VLSI Testing Symposium*, pages 337–343, 1996. The column labeled Prod. Term shows the numbers of product terms required to implement the bit-flipping functions, which correspond to the bit-fixing sequence generation logics of and the decoders in the disclosed BIST. See N. A. Touba and E. J. McCluskey, Altering a Pseudo-Random Bit Sequence for Scan-Based BIST, *In Proceedings IEEE International Test Conference*, pages 167–175, 1996; and M. Karkala, N A. Touba, and H.-J. Wunderlich. Special ATPG to Correlate Test Patterns for Low-Overhead Mixed-Mode BIST, *In proceedings 7γrd Asian Test Symposium*, 1998. The bit-flipping functions for all benchmark circuits are designed to achieve 100% fault coverage when 10,000 patterns are applied. For all cases, a 32 stage LFSR is used to generate pseudo-random sequences. Note that H.-J. Wunderlich considers only hard faults that remain undetected after 10,000 patterns applied. See H.-J. Wunderlich and G. Kiefer. Bit-Flipping BIST, In *Proceedings VLSI Testing Symposium*, pages 337–343, 1996. Hence, 10,000 patterns that are applied to detect easy faults are included, total test patterns applied to each circuit are 20,000.

Both the number of product terms and literal count required to implement the decoder are reported for the disclosed BIST. Even though, the sequences generated by the disclosed BISTs are shorter than those generated by other BISTs, hardware overhead required to implement the disclosed BISTs is lowest for all circuits except s1196. (10,000 patterns for N. A. Touba and E. J. McCluskey, Altering a Pseudo-Random Bit Sequence for Scan-Based BIST, In *Proceedings IEEE International Test Conference*, pages 167–175, 1996; and M. Karkala, N A. Touba, and H.-J. Wunderlich. Special ATPG to Correlate Test Patterns for Low-Overhead Mixed-Mode BIST, *In proceedings 7γrd Asian Test Symposium*, 1998; and 20,000 patterns for H.-J. Wunderlich and G. Kiefer. Bit-Flipping BIST, In *Proceedings VLSI Testing Symposium*, pages 337–343, 1996).

Also the sizes of Sequence ID. registers of, which correspond to COUNTERS of the disclosed BIST, are larger than the size of COUNTERS of the disclosed BIST for all circuits. See N. A. Touba and E. J. McCluskey, Altering a Pseudo-Random Bit Sequence for Scan-Based BIST, In *Proceedings IEEE International Test Conference*, pages 167–175, 1996; and M. Karkala, N A. Touba, and H.-J. Wunderlich. Special ATPG to Correlate Test Patterns for Low-Overhead Mixed-Mode BIST, *In proceedings 7γrd Asian Test Symposium*, 1998. Especially, for large circuits that have many hard faults such as c7552 c2670, hardware overhead required to implement the disclosed BISTs significantly lower than that to implement other BISTs.

IV.F. Conclusions

Techniques to reduce test sequence length and hardware overhead in 3-weight WRPT BIST (test-per-clock as well as test-per-scan) are taught. In the disclosed 3-weight WRPT BIST, inputs are fixed to required values by overriding random patterns signals when the corresponding overriding signals are activated. The hardware overhead due to implementing 3-weight WRPT BIST is typically determined by the number of generators and overriding signals. In order to reduce the number of generators and overriding signals, an improved ATPG that is an improvement over PODEM is disclosed that generates special testcubes for hard-to-detect faults. The selection in the disclosed ATPG is guided by the cost functions that estimate the number of generators and overriding signals required to achieve each objective. Since the disclosed BIST has a very simple architecture, the circuits to control the BIST can be implemented at low cost. Furthermore, the disclosed improved ATPG also minimizes the number of overriding signals as well as the number of generators. Finally, the overriding signals generated by the disclosed improved ATPG are further minimized by compatibility analysis and reordering scan chains. Experimental results for synthesis benchmark circuits demonstrate that hardware overhead required by the disclosed method is very low.

Since the disclosed method generates only suitable testcubes that have the least number of conflicting inputs with testcubes in the current testcube set, the procedure to select suitable testcubes from large pool of testcubes, that typically has high time complexity, is not required. Furthermore, since the complexity of computing cost functions is linear in the number of circuit lines, the time complexity of the disclosed improved ATPG is almost same as that of simple combinational ATPGs. Hence the disclosed BIST design methodology is applicable to large circuits.

Unlike some conventional techniques that require specially designed flip-flops, the disclosed technique does not require any special library modules. Hence, the disclosed technique can be implemented under any ASIC environment without designing special library modules to support the disclosed technique. Even though, only LFSRS are used to generate pure random pattern sequences in the experiments performed for this paper, any random pattern generator, which includes even traditional weighted random pattern generators such as M. Bershteyn, can be used to generate random pattern sequence for the disclosed BIST. See M. Bershteyn, Calculation of Multiple Sets of Weights for Weighted Random Testing, In *Proceedings IEEE International Test Conference*, pages 1031–1040, 1993. In addition, the disclosed BIST can be used combined with other design-for-test techniques such as test point insertion.

In some circuits, many inputs need to be fixed to set a single internal line to a desired value. If such lines are directly set to desired values by inserting test points, the number of overriding signals can also be reduced.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for generating a test set for hard to detect faults, said method comprising:
    a) identifying a set of hard to detect faults; and
    b) generating the test set for the hard to detect faults by using an automatic test pattern generator;
    wherein, the automatic test pattern generator comprises functionality for a global generator and is adapted to consider hardware overhead and test sequence lengths, said hardware overhead being incurred when a new testcube is added to the test set.

2. The method of claim 1, wherein the test set in step b is generated by a process further comprising:
    (i) calculating estimated cost using cost functions for each of the hard to detect faults;
    (ii) selecting a hitherto unselected target fault from the set of hard to detect faults that has a minimum cost;
    (iii) generating a testcube for the selected target fault;
    (iv) comparing real cost with estimated cost for the selected hard fault;
    (v) if the real cost is greater than a sum total of the estimated cost plus a predetermined error, performing an appropriate one of the following sub-steps:
        (1) if there are still unselected faults in the set of hard to detect faults, returning to step (b) (ii); or
        (2) if no unselected faults remain in the set of hard to detect faults, selecting a testcube having a minimum real cost;
    (vi) if real cost is not greater than a sum total of the estimated cost plus the predetermined error, retaining the test cube generated in step (b) (iii) as the selected test cube;
    (vii) marking all faults detected by the selected test cube; and
    (viii) adding the selected test cube into a current test set and updating a current generator.

3. The method of claim 2 wherein said cost functions comprises of controllability costs, observability costs and test generation costs.

4. The method of claim 3 wherein the controllability cost for an input is calculated based on the following formulae:

$$Cv(p_k) = \begin{cases} 0 & \text{if } g_k^i = U \\ 0 & \text{if } g_k^i = v \\ w & \text{if } g_k^i = \bar{v} \text{ (where } w \gg 1\text{)} \\ 1 & \text{if } g_k^i = X \text{ and } gg_k = B \\ 1 & \text{if } g_k^i = X \text{ and } gg_k = v \\ h & \text{if } g_k^i = X \text{ and } gg_k = \bar{v} \text{ (where } h \gg 1\text{)} \\ h & \text{if } g_k^i = X \text{ and } gg_k = N \end{cases} \quad (4)$$

where v is a binary value, 0 or 1, X is a don't care input,

Cv ($p_k$) represents cost for an input $P_k$, $g_k$ is an input in the current generator, and $gg_k$ represents an input in the global generator, and wherein the controllability cost of each input is used to estimate a number of input conflicts and overriding signals that would be created by setting a line to a binary value v.

5. The method of claim 3 wherein the controllability costs is calculated based on the following formulae:

a controllability cost for an internal circuit line l in the circuit, is $$Cv(l) = \begin{cases} \min_{l_a} \{Cc(l_a)\} & \text{if } v = c \oplus i \\ \sum_{l_a} C\bar{c}(l_a) & \text{otherwise,} \end{cases} \quad (5)$$

where $l_a$ and l are respectively the inputs and the output of a gate with controlling value c and inversion i.

6. The method of claim 3, wherein the test generation cost is a sum of cost to activate a specific fault on a line and a cost of propagating the fault through the line.

7. The method of claim 2 wherein in step (b) (iii) a number of specified inputs for the testcube are minimized by bit stripping.

8. A method of generating test sets for a fault list comprising hard to detect faults, the method comprising:

(a) initializing i←0 and glob_gen←{N,N, . . . ,N};

(b) initializing a current testcube set, $C^i \leftarrow \phi$;

(c) unmarking all faults in the fault list;

(d) initializing a current generator, gen($C^i$)={X,X, . . . ,X} and j←0;

(e) if there are no more faults in the fault list, then proceeding to step (m);

(f) generating a testcube $c^j$ using an ATPG;

(g) adding the testeube $c^j$ to a current testcube set, $C^i \leftarrow C^i \cup c^j$;

(h) mark faults detected by the testcube $c^j$;

(i) setting j←j+1;

(k) if the number of conflicting inputs of any testcube in $C^i$ is greater than a positive integer M then $C^i \leftarrow C^i - c^j$, i←i+1, updating global gen, and proceeding to step (b);

(l) if the number of conflicting inputs of any testeube in $C^i$ is not greater than M, updating gen($C^i$) and proceeding to step (e);

(m) generating 3-weight weighted random pattern testing (WRPT) patterns by fixing inputs or applying pure random patterns to inputs according to gen($C^i$); and (n) running fault simulation to drop the faults that are detected by the generated 3-weight WRPT patterns.

9. The method of claim 8, further comprising:

(o) merging compatible overriding signals.

10. The method of claim 8, wherein said generating a test cube in step (f) is done by a process comprising:

(i) calculating estimated cost using cost functions for each of the hard to detect faults;

(ii) selecting a hitherto unselected target fault from the set of hard to detect faults that has a minimum cost;

(iii) generating a testeube for the selected target fault;

(iv) comparing real cost with estimated cost for the selected target fault;

(v) if the real cost is greater than a sum total of the estimated cost plus a predetermined error, performing an appropriate one of the following sub-steps:
  (1) if there are still unselected faults in the set of hard to detect faults, returning to step (f) (ii); or
  (2) if no unselected faults remain in the set of hard to detect faults, selecting a testeube having a minimum real cost;

(vi) if real cost is not greater than a sum total of the estimated cost plus the predetermined error, retaining the test cube generated in step (f) (iii) as the selected test cube;

(vii) marking all faults detected by the selected test cube; and (viii) adding the selected test cube into a current test set and updating the current generator.

11. The method of claim 10, wherein inversely compatible inputs are merged by additionally inverting a signal before being fed to a gate.

12. The method of claim 10 wherein the controllability cost for an input is calculated based on the following formulae:

$$Cv(p_k) = \begin{cases} 0 & \text{if } g_k^i = U \\ 0 & \text{if } g_k^i = v \\ w & \text{if } g_k^i = \bar{v} \text{ (where } w \gg 1) \\ 1 & \text{if } g_k^i = X \text{ and } gg_k = B \\ 1 & \text{if } g_k^i = X \text{ and } gg_k = v \\ h & \text{if } g_k^i = X \text{ and } gg_k = \bar{v} \text{ (where } h \gg 1) \\ h & \text{if } g_k^i = X \text{ and } gg_k = N \end{cases} \quad (4)$$

where v is a binary value, 0 or 1, X is a don't care input,

Cv ($p_k$) represents cost for an input $p_k$, $g_k$ is an input in the current generator, and $gg_k$ represents an input in the global generator, and wherein the controllability cost of each input is used to estimate a number of input conflicts and overriding signals that would be created by setting a line to a binary value v.

13. The method of claim 10 wherein the controllability costs is calculated based on the following formulae:

a controllability cost for an internal circuit line l in the circuit, is $$Cv(l) = \begin{cases} \min_{l_a} \{Cc(l_a)\} & \text{if } v = c \oplus i \\ \sum_{l_a} C\bar{c}(l_a) & \text{otherwise,} \end{cases} \quad (5)$$

where $l_a$ and l are respectively the inputs and the output of a gate with controlling value c and inversion i.

14. The method of claim 10, wherein the test generation cost is a sum of cost to activate a specific fault on a line and a cost of propagating the fault through the line.

15. A parallel type test per scan built-in self test circuit comprising:

a circuit under test comprising inputs;

a set of scan flip flops that are connected to the inputs, each of said scan flip flops having at least a synchronous reset (R) or a synchronous preset (S) pin;

a LFSR for loading random vectors that provide input to the set of scan flip-flops;

a decoder providing decoder outputs, wherein said decoder outputs control the R and S pins in the scan flip-flops, said decoder comprising a functionality of a global generator;

a counter providing inputs to the decoder that determine a state of the decoder outputs; and an enable input for the decoder, wherein the decoder provides overriding signals to by controlling the input to the R and S pins, said overriding signals overriding the random vectors based on tests in a generator for test patterns for hard faults, said tests being generated by an automatic test pattern generator.

16. The circuit of claim 15 wherein the enable is provided by an AND gate, that performs an AND operation on a override enable input signal and a last scan input signal.

17. The circuit of claim 16, wherein random patterns are overridden and the BIST enabled by providing a 1 input to the override enable input signal.

18. The circuit of claim 16, wherein the last scan input signal is set to a 1 only at a last cycle of each scan shifting operation.

19. The circuit of claim 15, wherein the counter being adapted to be set to 0 initially and maintained at 0 while a specific number (T) of random patterns are input, said random patterns being modified based on the generator provided by the decoder, said counter being further adapted to be incremented and T random patterns applied with a new generator, said increment being repeated until all generators have been applied by the decoder.

20. The circuit of claim 15, wherein compatible overriding signals that can be merged are driven by a same output signal of the decoder, thereby reducing a number of decoder outputs.

21. The circuit of claim 15, wherein inversely compatible overriding signals are driven by a decoder output directly and the same decoder output after passing through an invertor.

22. The circuit of claim 15, wherein if a scan input is assigned a 1 by the global generator, then the corresponding scan flip-flop has an S pin.

23. The circuit of claim 15, wherein if a scan input is assigned a 0 by the global generator, then the corresponding scan flip-flop has an R pin.

24. The circuit of claim 15, wherein if a scan input is assigned both a 0 and 1 by the global generator, then the corresponding scan flip-flop has both R and S pins.

25. The circuit of claim 15, wherein if a scan flip-flop already has a high active S pin and whose corresponding scan input is assigned a 1 in the global generator, then a two input OR gate is inserted between the S pin and a normal present signal.

26. The circuit of claim 15, wherein if a scan flip-flop already has a high active R pin and whose corresponding scan input is assigned a 0 in the global generator, then a two input OR gate is inserted between the S pin and a normal present signal.

27. The circuit of claim 15, wherein if a scan flip-flop already has a low active S pin and whose corresponding scan input is assigned a 1 in the global generator, then a two input AND gate is inserted between the S pin and a normal present signal.

28. The circuit of claim 15, wherein if a scan flip-flop already has a low active R pin and whose corresponding scan input is assigned a 0 in the global generator, then a two input AND gate is inserted between the S pin and a normal present signal.

29. A serial type test per scan built-in self-test circuit comprising:

a circuit under test comprising inputs;

a set of scan flip flops that are connected to the inputs;

a LFSR for loading random vectors that provide input to the set of scan flip-flops;

an AND gate and an OR gate inserted between said LFSR and the set of scan flip flops;

a decoder providing two decoder output signals $D_0$ and $D_1$, said decoder output signals being input to the AND and OR gates;

a generator counter that selects a generator providing inputs to the decoder;

a scan counter that provides input to the decoder, wherein a state of the decoder outputs are together determined by the counter input and the scan counter input; and an enable input for the decoder, wherein the decoder provides overriding signals, said overriding signals overriding the random vectors based on tests in a generator for test patterns for hard faults, said tests being generated by an automatic test pattern generator.

30. The circuit of claim 29, wherein area overhead of the decoder is reduced by inserting toggle flip-flops between the two outputs of the decoder and inputs to the AND and OR gates.

31. The circuit of claim 30, wherein an order of scanning is determined by using genetic algorithms, wherein a permutation of scan elements in the scan chain is used as a genetic code, and the genetic algorithm is used to determine an order of scan elements that leads to a minimum number of minterms.

32. The circuit of claim 31 wherein compatible overriding signals are merged prior to applying genetic algorithms.

33. The circuit of claim 32, wherein scan inputs in a group of compatible scans are rearranged to satisfy routing or load capacity.

34. The circuit of claim 29, wherein inputs from the random vector corresponding to conflicting inputs in the generator are not overridden.

35. The circuit of claim 29, wherein the scan_counter is adapted to increase by 1 at every positive edge of a scan clock and new values for scan inputs are scanned in serially until inputs corresponding to all pins have been scanned in, wherein if a value in a generator is a 1, a 1 is scanned in as a scan input in a corresponding pin, instead of a value provided by the random vector, and if a value in the generator is a 0, a 0 is scanned in as a scan input in a corresponding pin, instead of a value provided by the random vector and if a value in the generator is a don't care or a conflicting value, then a value in the random vector is scanned in.

* * * * *

UNITED STATES PATENT AND TRADEMARK OFFICE
CERTIFICATE OF CORRECTION

PATENT NO.   : 6,886,124 B2
DATED        : April 26, 2005
INVENTOR(S)  : Seongmoon Wang It is certified that error appears in the above-identified patent and that said Letters Patent is hereby corrected as shown below:

Column 6,
Line 1, delete "diables" and insert -- disables --.

Column 16,
Line 18, delete "C." and insert -- $C^i$ --.

Column 35,
Lines 19, 26, 45 and 55, delete "testeube" and insert -- testcube --.

Signed and Sealed this

Twenty-seventh Day of December, 2005

JON W. DUDAS
*Director of the United States Patent and Trademark Office*